(12) United States Patent
Chin et al.

(10) Patent No.: US 11,776,652 B2
(45) Date of Patent: Oct. 3, 2023

(54) NON-VOLATILE STORAGE DEVICE, DATA READOUT METHOD, AND NON-TRANSITORY COMPUTER READABLE STORAGE MEDIUM

(71) Applicant: MegaChips Corporation, Osaka (JP)

(72) Inventors: Kantatsu Chin, Osaka (JP); Atsufumi Kawamura, Osaka (JP)

(73) Assignee: MEGACHIPS CORPORATION, Osaka (JP)

( * ) Notice: Subject to any disclaimer, the term of this patent is extended or adjusted under 35 U.S.C. 154(b) by 24 days.

(21) Appl. No.: 17/507,803

(22) Filed: Oct. 22, 2021

(65) Prior Publication Data
US 2022/0044755 A1 Feb. 10, 2022

Related U.S. Application Data

(63) Continuation of application No. PCT/JP2020/004141, filed on Feb. 4, 2020.

(30) Foreign Application Priority Data

Apr. 24, 2019 (JP) ................. 2019-083040

(51) Int. Cl.
G11C 29/42 (2006.01)
G11C 29/12 (2006.01)
G11C 29/18 (2006.01)

(52) U.S. Cl.
CPC ......... *G11C 29/42* (2013.01); *G11C 29/1201* (2013.01); *G11C 29/12005* (2013.01); *G11C 29/18* (2013.01); *G11C 2029/1802* (2013.01)

(58) Field of Classification Search
None
See application file for complete search history.

(56) References Cited

U.S. PATENT DOCUMENTS

| 7,508,704 | B2 | 3/2009 | Honma et al. |
| 7,872,910 | B2 | 1/2011 | Honma et al. |
| 9,110,827 | B2 | 8/2015 | Sakai et al. |
| 2008/0123408 | A1 | 5/2008 | Honma et al. |
| 2009/0201726 | A1 | 8/2009 | Honma et al. |
| 2014/0129904 | A1 | 5/2014 | Sakai et al. |

FOREIGN PATENT DOCUMENTS

| JP | 2008-16092 A | 1/2008 |
| JP | 2013-137848 A | 7/2013 |
| JP | 2014-93654 A | 5/2014 |

OTHER PUBLICATIONS

International Search Report and Written Opinion dated Apr. 7, 2020, received for PCT Application PCT/JP2020/004141, Filed on Feb. 4, 2020, 9 pages including English Translation.

*Primary Examiner* — Guerrier Merant
(74) *Attorney, Agent, or Firm* — XSENSUS LLP

(57) ABSTRACT

Provided is a non-volatile storage system that performs error correction processing at high speed while ensuring error correction capability. When error correction decoding processing using data read first with hard-decision decoding processing has failed, a non-volatile storage device 2 reads data on the same page again, performs diversity synthesis processing on the readout data for the first time and the readout data for the second time on the same page as one for the first time, and then performs error correction processing using data after diversity synthesis processing.

7 Claims, 9 Drawing Sheets

NON-VOLATILE STORAGE DEVICE, DATA READOUT METHOD, AND NON-TRANSITORY COMPUTER READABLE STORAGE MEDIUM

CROSS-REFERENCE TO RELATED APPLICATIONS

This application is a Bypass Continuation which is based on PCT filing PCT/JP2020/004141, filed Feb. 4, 2020, which claims priority to JP 2019-083040, filed Apr. 24, 2019, the entire contents of each are incorporated herein by reference.

TECHNICAL FIELD

The present invention relates to a non-volatile storage system and a method for controlling a non-volatile storage device.

BACKGROUND ART

In NAND flash memory, which is a semiconductor non-volatile memory, the reliability of written data is decreasing with the progress of cell miniaturization technology and multi-value technology, and the demand for error correction code is increasing. To adopt, as an error correction code, an LDPC code (Low-density parity-check code) having high error correction capability instead of the conventionally adopted BCH codes (Bose-Chaudhuri-Hocquenghem codes) in a NAND flash memory, a lot of research and development is being done for the practical use of LDPC codes.

Performing error correction code decoding when reading data from a NAND flash memory improves the reliability of readout data. In the NAND flash memory, a hard determination decoding processing (i.e., hard-decision decoding processing) that decodes an error correction code using only the digital value of the readout data is usually performed. This hard-decision decoding processing performs the error correction code decoding processing using only the digital value of the readout data, and thus the processing speed is high, but there are cases where sufficient error correction cannot be performed by this method. To deal with such cases, a technique for performing error correction processing by soft-decision decoding processing has been developed. For example, Patent Document 1 discloses a technique of performing error correction processing by soft-decision decoding processing to improve the error correction capability for the NAND flash memory and improve the reliability of readout data.

PRIOR ART DOCUMENTS

Patent Document 1: Japanese Unexamined Patent Publication No. 2008-16092

DISCLOSURE OF INVENTION

Technical Problem

However, performing the error correction processing with the soft-decision decoding processing requires reading at least three times, thus prolonging the processing time. This is because in the soft-decision decoding process requires generating information called a log-likelihood ratio (LLR) that indicates the certainty of the data, and multiple readings are required for generating the LLR.

The log-likelihood ratio LLR is information expressing a probability that the value of each symbol (bit) is "0" and a probability that the value of each symbol (bit) is "1" using a logarithmic ratio. Specifically, in the NAND flash memory, the log-likelihood ratio LLR is set as a logarithm of a ration of (1) a conditional probability $P(x=0|a)$ in which a bit x written to the memory cell is a logical value of "0" under the condition that the value of the voltage (threshold voltage) when reading data for each memory cell is included in the voltage range "a" and (2) a conditional probability $P(x=1|a)$ in which a bit x written to the memory cell is a logical value of "1" under the condition that the value of the voltage (threshold voltage) when reading data for each memory cell is included in the voltage range "a". In other words, the log-likelihood ratio LLR is expressed as follows:

$$LLR=\log(P(x=0|a)/P(x=1|a))$$

Note that log denotes a natural logarithm.

The error correction processing with the soft-decision decoding process (soft decision decoding process) needs to improve the accuracy of the log-likelihood ratio LLR in order to improve the error correction capability. To improve the accuracy of the log-likelihood ratio LLR, it is necessary to perform the process of reading data for each memory cell multiple times while finely changing the value of the voltage (threshold voltage) when reading data for each memory cell. As a result, in the error correction processing with the soft-decision decoding processing (soft-decision decoding processing), the processing time becomes long (latency becomes long).

In view of the above problems, it is an object of the present invention to provide a non-volatile storage system, a non-volatile storage device, and a data readout method, and a program that perform error correction processing capable of high-speed processing (achieving high throughput) while ensuring error correction capability.

Solution to Problem

To solve the above problems, a first aspect of the present invention provides a non-volatile storage device including a memory interface circuitry and an error correction processing circuitry.

The memory interface circuitry performs data write processing and/or data readout processing to the non-volatile memory.

The error correction processing circuitry performs error correction code decoding processing on data read from the non-volatile memory by the memory interface circuitry.

(1) When the error correction code decoding processing is performed on the data read from a first address of the non-volatile memory by the memory interface circuitry, and the error correction processing determines that decoding an error correction code has been successful, the error correction processing circuitry outputs data obtained by the error correction code decoding processing.

(2) When the error correction code decoding processing is performed on data read from the first address of the non-volatile memory by the memory interface circuitry, and the error correction processing determines that decoding an error correction code has failed, the memory interface circuitry reads data from the first address of the non-volatile memory again.

Further, in this case, the error correction processing circuitry performs diversity synthesis processing, which is a process of synthesizing the data read for the first time from the first address and the data read for the second time from the first address, performs the error correction code decoding processing on data obtained by the diversity synthesis processing, and outputs data obtained by the error correction code decoding processing when decoding the error correction code has been successful.

The non-volatile storage device performs error correction code decoding processing on data obtained by the diversity synthesis processing only when decoding using the hard-decision decoding processing, which is a conventional technique, has failed. In other words, in the non-volatile storage device, performing soft-decision processing with the diversity synthesis data only when decoding using the conventional technique (hard-decision decoding processing) has failed achieves both of the processing speed to be required and the error correction capability to be required. In other words, the non-volatile storage device can fine-tune the number of data readout times to the required minimum number of times depending on the required correction capability and processing speed, compared to the conventional technique, that is, the soft-decision decoding processing that is performed when decoding using the hard-decision decoding processing has failed, thereby allowing data readout processing to be performed with high efficiency and with a high speed.

Further, when the ECC decoding process using the first readout data has failed, the non-volatile storage device reads data on the same page again (performs the second data readout processing), performs diversity synthesis processing on the readout data for the first time and the readout data for the second time on the same page as one for the first time, and then performs error correction processing using data after diversity synthesis processing. There is a high possibility that the ECC decoding processing for the data after diversity synthesis processing will succeed; and therefore performing the process as described above in the non-volatile storage system improves the error correction capability. In other words, a plurality of pieces of data that has been read multiple times from the same page in the NAND flash memory have diversity in that the number of error bits and the bit position where the error occurs fluctuate, and therefore the data obtained by the synthesis processing has a high possibility that the error correction processing will succeed when the ECC decoding processing is performed. Thus, performing the ECC decoding processing for the data after diversity synthesis processing in the non-volatile storage device when the ECC decoding processing for the first readout data has failed improves the error correction capability.

As described above, the non-volatile storage device performs high-speed data readout processing while ensuring high error correction capability.

A second aspect of the present invention provides the non-volatile storage device of the first aspect of the present invention in which when it is determined that decoding the error correction code for the data obtained by performing the diversity synthesis processing using the data read for the first time from the first address and the data read for the second time from the first address has failed, the memory interface unit performs the following processing.

The memory interface circuitry further reads data from the first address of the non-volatile memory, performs diversity synthesis processing on the latest readout data, which is the data read from the first address, and data read from the first address of the non-volatile memory before reading the latest readout data, and performs the error correction code decoding processing on the data obtained by the diversity synthesis processing. When decoding the error correction code by the error correction code decoding processing has been successful, the memory interface circuitry outputs the data obtained by the error correction code decoding processing. Conversely, when decoding the error correction code by the error correction code decoding processing has failed, the memory interface circuitry further reads data from the first address of the non-volatile memory, performs diversity synthesis processing on the latest readout data, which is the data read from the first address, and data read from the first address of the non-volatile memory before reading the latest readout data, performs the error correction code decoding processing on the data obtained by the diversity synthesis processing, and repeatedly performs the above processing.

In this non-volatile storage device, ECC decoding processing is performed using the data obtained by diversity synthesis processing of the data read multiple times from the same page until the decoding processing is successful, and new information is added each time data has been read, thereby enhancing the error correction capability. Thus, in this non-volatile storage device, the error correction capability can be gradually enhanced by increasing the number of readings by one.

A third aspect of the present invention provides the non-volatile storage device of the first or second aspect of the present invention in which when it is determined that decoding the error correction code for the data obtained by performing the diversity synthesis processing has failed, the memory interface circuitry adjusts a threshold voltage when reading data from the non-volatile memory, and reads data from the non-volatile memory.

When the error correction processing has not been successful, the non-volatile storage device performs diversity synthesis processing using the readout data obtained by changing the threshold voltage at the time of reading data (for example, randomly within a predetermined range) in order to increase the diversity, thereby obtaining readout data with the influence on the non-volatile memory (for example, influence of data retention, influence of read disturbance, and the like) reduced; furthermore the non-volatile storage device performs error correction processing on the readout data obtained as described above, thereby allowing the error correction processing to be performed with higher accuracy.

A fourth aspect of the present invention provides the non-volatile storage device of the third aspect of the present invention in which when it is determined that decoding the error correction code for the data obtained by performing the diversity synthesis processing has failed, and the memory cell of the non-volatile memory at the first address has been greatly affected by data retention, the memory interface circuitry adjusts the threshold voltage such that the threshold voltage when reading data from the non-volatile memory is lower than a reference threshold voltage when reading data from the non-volatile memory, and then readout data from the non-volatile memory.

Thus, when it is determined that the influence of data retention is large in the non-volatile storage device, the possibility of reading correct data increases, thereby achieving error correction processing with high accuracy.

A fifth aspect of the present invention provides the non-volatile storage device of the third aspect of the present invention in which when it is determined that decoding the error correction code for the data obtained by performing the diversity synthesis processing has failed, and the memory cell of the non-volatile memory at the first address has been greatly affected by read disturbance, the memory interface circuitry adjusts the threshold voltage such that the threshold voltage when reading data from the non-volatile memory is higher than a reference threshold voltage when reading data from the non-volatile memory, and then readout data from the non-volatile memory.

Thus, when it is determined that the influence of the read disturbance is large in the non-volatile storage device, the possibility of reading the correct data increases, thereby achieving error correction processing with high accuracy.

A sixth aspect of the present invention provides the non-volatile storage device of one of the first to the fifth aspects of the present invention in which when it is determined that decoding the error correction code for the data obtained by performing the diversity synthesis processing has failed, the memory interface circuitry reads data from the first address of the non-volatile memory after a predetermined time has lapsed.

This enhances the degree of diversity of the i-th (i is a natural number) readout data and the i+1-th readout in the non-volatile storage device, thereby enhancing the accuracy of the error correction processing. For example, it is preferable that the time between the i-th data readout processing and the i+1-th data readout processing is set as long as possible within the time that can comply with the data readout time specified by a predetermined standard (for example, SD standard). Further, the time between the i-th data readout processing and the i+1-th data readout processing may be a fixed time or a variable time.

A seventh aspect of the present invention provides a non-volatile storage device including a memory interface circuitry and an error correction processing circuitry.

The memory interface circuitry that performs data write processing and/or data readout processing to the non-volatile memory.

The error correction processing circuitry that performs error correction code decoding processing on data read from the non-volatile memory by the memory interface circuitry.

(1) When the error correction code decoding processing is performed on the data read from a first address of the non-volatile memory by the memory interface circuitry, and the error correction processing determines that decoding an error correction code has been successful, the error correction processing circuitry outputs data obtained by the error correction code decoding processing.

(2) When the error correction code decoding processing is performed on data read from the first address of the non-volatile memory by the memory interface circuitry, and the error correction processing determines that decoding an error correction code has failed, the memory interface circuitry reads data again from a second address different from the first address in which the same data as the data stored in the first address of the non-volatile memory has been stored.

Further, in this case, the error correction processing circuitry performs diversity synthesis processing, which is a process of synthesizing the data read from the first address and the data read from the second address, performs the error correction code decoding processing on data obtained by the diversity synthesis processing, and outputs data obtained by the error correction code decoding processing when decoding the error correction code has been successful.

When the ECC decoding processing using the first readout data (data read from the first physical block) has failed, the non-volatile storage device reads data from the second address where the same data has been stored again, performs diversity synthesis processing on two pieces of data that have been read from different addresses in which the same data has been stored, performs the diversity synthesis processing, and then performs error correction processing using data after diversity synthesis processing. Since the error occurrence states are different in different addresses, a possibility that the ECC decoding processing for the data after diversity synthesis processing will succeed become higher. Thus, the non-volatile storage device performs the processing as described above, thereby improving the error correction capability.

As described above, the non-volatile storage device performs high-speed data readout processing while ensuring high error correction capability.

Note that the "first address" is, for example, an address in the first physical block, and the "second address" is, for example, an address in the second physical block, which is a physical block different from the first physical block. In other words, when the same data has been written in the "first address" of the first physical block and the "second address" of the second physical block, performing the above-described processing using the data read from the "first address" of the first physical block and the data read from the "second address" of the second physical block improves the error correction capability.

When the same data is written to different addresses for redundancy, the unit for writing the same data may be as follows.

(1) When a plurality of non-volatile memories are provided, data may be written in units of blocks or in units of pages.

(2) When a single non-volatile memory is provided and a plurality of planes are provided, data may be written in units of blocks or in units of pages.

In this case, the blocks (or pages) for writing the same data are preferably blocks (or pages) included in different planes.

An eighth aspect of the present invention provides a data readout method used for a non-volatile storage device including a memory interface circuitry that performs data write processing and/or data readout processing to the non-volatile memory; and an error correction processing circuitry that performs error correction code decoding processing on data read from the non-volatile memory by the memory interface circuitry. The data readout method includes a first step and a second step.

In the first step, (1) when the error correction code decoding processing is performed on the data read from a first address of the non-volatile memory by the memory interface circuitry, and the error correction processing determines that decoding an error correction code has been successful, the error correction processing circuitry outputs data obtained by the error correction code decoding processing.

In the second step, (2) when the error correction code decoding processing is performed on data read from the first address of the non-volatile memory by the memory interface circuitry, and the error correction processing determines that decoding an error correction code has failed, the memory interface circuitry reads data from the first address of the non-volatile memory again. Further, the error correction processing circuitry performs diversity synthesis processing, which is a process of synthesizing the data read for the first time from the first address and the data read for the second time from the first address, performs the error correction code decoding processing on data obtained by the diversity synthesis processing, and outputs data obtained by the error correction code decoding processing when decoding the error correction code has been successful.

This achieves a data readout method having the same advantageous effects as the non-volatile storage device of the first aspect of the present invention.

A ninth aspect of the present invention provides a data readout method used for a non-volatile storage device including a memory interface circuitry that performs data write processing and/or data readout processing to the non-volatile memory; and an error correction processing circuitry that performs error correction code decoding processing on data read from the non-volatile memory by the memory interface circuitry. The data readout method includes a first step and a second step.

In the first step, (1) when the error correction code decoding processing is performed on the data read from a first address of the non-volatile memory by the memory interface circuitry, and the error correction processing determines that decoding an error correction code has been successful, the error correction processing circuitry outputs data obtained by the error correction code decoding processing.

In the second step, (2) when the error correction code decoding processing is performed on data read from the first address of the non-volatile memory by the memory interface circuitry, and the error correction processing determines that decoding an error correction code has failed, the memory interface circuitry reads data again from a second address different from the first address in which the same data as the data stored in the first address of the non-volatile memory has been stored. Further, the error correction processing circuitry performs diversity synthesis processing, which is a process of synthesizing the data read from the first address and the data read from the second address, performs the error correction code decoding processing on data obtained by the diversity synthesis processing, and outputs data obtained by the error correction code decoding processing when decoding the error correction code has been successful.

This achieves a data readout method having the same advantageous effects as the non-volatile storage device of the seventh aspect of the present invention.

The tenth aspect of the present invention provides a program for causing a computer to execute the data readout method according to the eighth or ninth aspects of the present invention.

This achieves a program for causing a computer to execute the data readout method having the same advantageous effects as the data readout method of the eighth or ninth aspect of the present invention.

Advantageous Effects

The present invention provides a non-volatile storage system, a non-volatile storage device, and a data readout method, and a program that perform error correction processing capable of high-speed processing (achieving high throughput) while ensuring error correction capability.

BEST MODE FOR CARRYING OUT THE INVENTION

First Embodiment

A first embodiment will be described below with reference to drawings.

1.1: Configuration of Non-volatile Storage System

Figure 1:
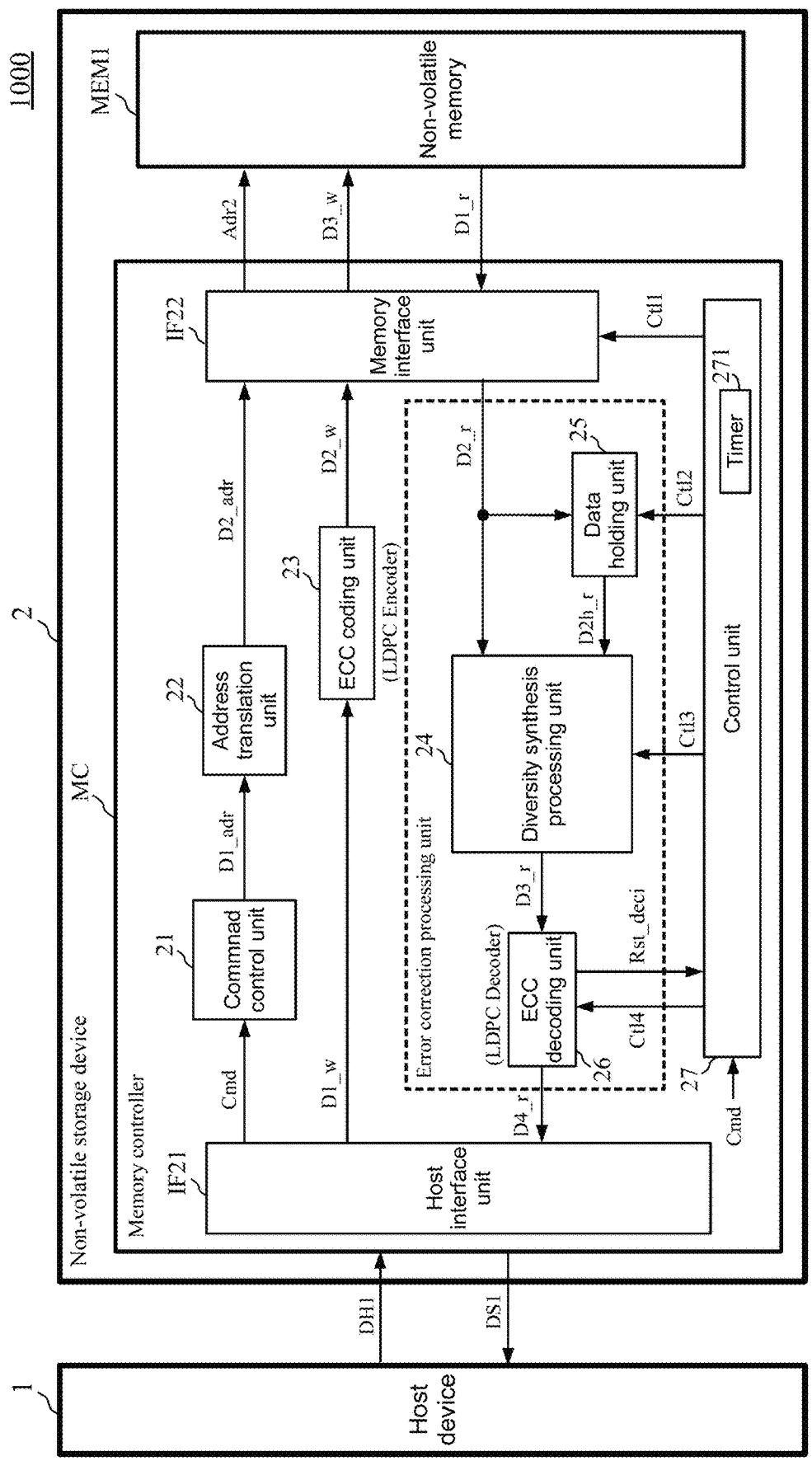
FIG. 1 is a schematic configuration diagram of a non-volatile storage system 1000 according to a first embodiment.

FIG. 1 is a schematic configuration diagram of a non-volatile storage system 1000 according to the first embodiment.

As shown in FIG. 1, the non-volatile storage system 1000 includes a host device 1 and a non-volatile storage device 2. The host device 1 and the non-volatile storage device 2 are connected via, for example, a bus.

As shown in FIG. 1, the non-volatile storage device 2 includes a memory controller MC and a non-volatile memory MEM1.

As shown in FIG. 1, the memory controller MC includes a host interface unit IF21, a memory interface unit IF22, a command control unit 21, an address translation unit 22, an ECC coding unit 23, a diversity synthesis processing unit 24, a data holding unit 25, an ECC decoding unit 26, and a control unit 27.

The host device 1 can be electrically connected to the non-volatile storage device 2 via a bus (a communication path for transmitting and receiving clock signals, data, commands, and the like). The host device 1 transmits commands, data, and the like to the non-volatile storage device 2, and/or receives a status signal, data, and the like from the non-volatile storage device 2.

The non-volatile storage device 2 includes a non-volatile memory MEM1 capable of storing data and a memory controller MC for controlling the non-volatile memory MEM1. The non-volatile storage device 2 can be electrically connected to the host device 1 via a bus (a communication path for transmitting and receiving clock signals, data, commands, and the like). The non-volatile storage device 2 receives commands, data, and the like from the host device 1, and/or transmits a status signal, data, and the like to the host device 1.

The non-volatile memory MEM is, for example, a NAND flash memory (for example, a NAND flash memory capable of storing multi-value data in one memory cell), and can write and/or readout data under the control of a memory controller MC.

The memory controller MC controls the data writing processing and/or readout processing of the non-volatile memory MEM1. As shown in FIG. 1, the memory controller MC includes a host interface unit IF21, a memory interface unit IF22, a command control unit 21, an address translation unit 22, an ECC coding unit 23, a diversity synthesis processing unit 24, a data holding unit 25, an ECC decoding unit 26, and a control unit 27.

The host interface unit IF21 is an interface unit with the host device 1. The host interface unit IF21 is connected to the host device 1 with a bus, for example, and receives data, commands, and the like from the host device 1 via the bus (transmission data including data, commands and the like transmitted from the host device 1 to the non-volatile storage device 2 is referred to as data DH1). Further, the host interface unit IF21 transmits a status signal, data, and the like to the host device 1 via the bus (transmission data including the status signal, data, and the like transmitted from the non-volatile storage device 2 to the host device 1 is referred to as data DS1).

The host interface unit IF21 transmits a command received from the host device 1 to the command control unit 21 and the control unit 27 as a command Cmd. Further, when the command received from the host device 1 is a write command, the host interface unit IF21 transmits the write data associated with the write command to the ECC coding unit 23 as data D1_w.

Further, the host interface unit IF21 receives readout data (data D4_r) transmitted from the ECC decoding unit 26. The host interface unit IF21 then transmits the received readout data (data D4_r) to the host device 1 via the bus as data DS1.

The command control unit 21 receives the command Cmd transmitted from the host interface unit IF21. The command control unit 21 decodes the command Cmd transmitted from the host interface unit IF21 and obtains a logical address specified by the command. The command control unit 21 then transmits the data including the information about the obtained logical address to the address translation unit 22 as the data D1_adr.

The address translation unit 22 receives data D1_adr including information about the logical address transmitted from the command control unit 21. Further, the address translation unit 22 has a logical-address/physical-address translation table. The address translation unit 22 converts a logical address included in the data D1_adr received from the command control unit 21 into a physical address based on the logical-address/physical-address translation table. The address translation unit 22 then transmits data including information about the physical address to the memory interface unit IF22 as data D2_adr.

The ECC coding unit 23 receives the write data D1_w transmitted from the host interface unit IF21. The ECC coding unit 23 performs, for example, LDPC coding processing on the received write data D1_w, and transmits the data obtained by the LDPC coding processing to the memory interface unit IF22 as data D2_w.

The memory interface unit IF22 is an interface unit that controls a process of writing data to the non-volatile memory MEM1 and/or a process of reading data from the non-volatile memory MEM1. The memory interface unit IF22 receives the data D2_adr transmitted from the address translation unit 22, the data D2_w transmitted from the ECC coding unit 23, and the control signal Ctrl1 transmitted from the control unit 27.

When the process of writing data to the non-volatile memory MEM1 is performed, the memory interface unit IF22 receives the data D2_adr including the physical address (write address) transmitted from the address translation unit 22 and the write data D1_w transmitted from the ECC coding unit 23. In accordance with the control signal Ctrl1 from the control unit 27, the memory interface unit IF22 performs data writing process control to the non-volatile memory MEM1 such that, in the non-volatile memory MEM1, the write data D1_w transmitted from the ECC coding unit 23 is written to the physical address (write address) included in the data D2_adr.

When performing a process of reading data from the non-volatile memory MEM1, the memory interface unit IF22 receives data D2_adr including a physical address (read address) transmitted from the address translation unit 22. The memory interface unit IF22 then performs data reading control to the non-volatile memory MEM1 so as to readout data stored in the physical address (read address) included in the data D2_adr in the non-volatile memory MEM1. The memory interface unit IF22 then transmits the readout data as data D2_r to the diversity synthesis processing unit 24 and the data holding unit 25.

The diversity synthesis processing unit 24 receives the data D2_r transmitted from the memory interface unit IF22, the data D2h_r transmitted from the data holding unit 25, and the control signal Ctrl3 transmitted from the control unit 27.

(1) When the control signal Ctrl3 is a signal value instructing the execution of diversity synthesis processing, the diversity synthesis processing unit 24 performs the diversity synthesis processing using the data D2_4 and the data D2h_4, and then transmits data after the processing to the ECC decoding unit 26 as data D3_r.

(2) When the control signal Ctrl3 is a signal value that does not instruct the execution of the diversity synthesis processing, the diversity synthesis processing unit 24 transmits the data D2_4 to the ECC decoding unit 26 as the data D3_r.

The data holding unit 25 receives the data D2_r transmitted from the memory interface unit IF22 and the control signal Ctrl2 transmitted from the control unit 27. The data holding unit 25 stores and holds the data D2_r. Further, the data holding unit 25 transmits the stored data as the data D2h_r to the diversity synthesis processing unit 24 in accordance with the control signal Ctrl2 from the control unit 27.

The ECC decoding unit 26 receives the data D3_r transmitted from the diversity synthesis processing unit 24 and the control signal Ctrl4 transmitted from the control unit 27. The ECC decoding unit 26 performs LDPC decoding processing on the data D3_r in accordance with the control signal Ctrl4, and transmits the data obtained by the LDPC decoding processing to the host interface unit IF21 as the data D4_r.

The control unit 27 receives the command Cmd transmitted from the host interface unit IF21. In accordance with the command Cmd (based on a mode determined by the command Cmd (data read mode/data write mode)), the control unit 27 generates the control signal Ctrl1 for controlling the memory interface unit IF22, the control signal Ctl2 for controlling the data holding unit 25, the control signal Ctl3 for controlling the diversity synthesis processing unit 24, and the control signal Ctl4 for controlling the ECC decoding unit 26, and then transmits each of the generated control signals, at a predetermined timing, to the memory interface unit IF22, the data holding unit 25, the diversity synthesis processing unit 24, and the ECC decoding unit 26. Further, the control unit 27 includes a timer 271 and can transmits a control signal after a predetermined time has elapsed from a predetermined time.

Note that the function of the "error correction processing unit" is achieved with the diversity synthesis processing unit 24, the data holding unit 25, and the ECC decoding unit 26.

1.2: Operation of Non-Volatile Storage System

The operation of the non-volatile storage system 1000 configured as described above will be described with reference to the drawings. In the following, the data writing process and the data readout processing will be described separately.

1.2.1: Data Writing Processing

First, the data writing processing will be described.

The host device 1 transmits a write command and write data to the memory controller MC.

The host interface unit IF21 obtains a write command and transmits the obtained write command (command Cmd) to the command control unit 21 and the control unit 27.

The command control unit 21 decodes the write command (command Cmd) and obtains a write logical address. The command control unit 21 then transmits the data including the information about the obtained write logical address to the address translation unit 22 as the data D1_adr.

The address translation unit 22 converts the received write logical address (write logical address included in the data D1_adr) into a physical address based on the logical-address/physical-address translation table. The address translation unit 22 then transmits the data including the physical address to the memory interface unit IF22 as the data D2_adr.

The host interface unit IF21 transmits the write data associated with the write command (this is referred to as D1_w) to the ECC coding unit 23.

The ECC coding unit 23 performs LDPC coding processing on the write data D1_w transmitted from the host interface unit IF21, and obtains data after the LDPC coding processing as data D2_w. The ECC coding unit 23 then transmits the obtained data D2_w to the memory interface unit IF22. Note that the LDPC coding processing is preferably performed in units of the number of bits corresponding to a page, which is the data readout unit of the non-volatile memory MEM1. For example, when the data to be written on one page of the non-volatile memory MEM1 is N bits (N is a natural number), the LDPC codeword generated by the LDPC coding processing is N bits of data.

In accordance with the control signal Ctl1, the memory interface unit IF22 transmits the write address included in the data D2_adr transmitted from the address translation unit 22 and the write data (code data) D2_w transmitted from the ECC coding unit 23 to the non-volatile memory MEM1. The write data is then written to the write address specified by the memory interface unit IF22 in the non-volatile memory MEM1. Note that data is written to the non-volatile memory MEM1 in the minimum write unit specified for the non-volatile memory. For example, when the non-volatile memory is a TLC NAND flash memory (TLC: Triple Level Cell), the minimum write unit is three pages. Note that the "minimum write unit specified for the non-volatile memory" should not be limited to the above.

1.2.2: Data Read Processing

Next, the data readout processing will be described.

Figure 2:
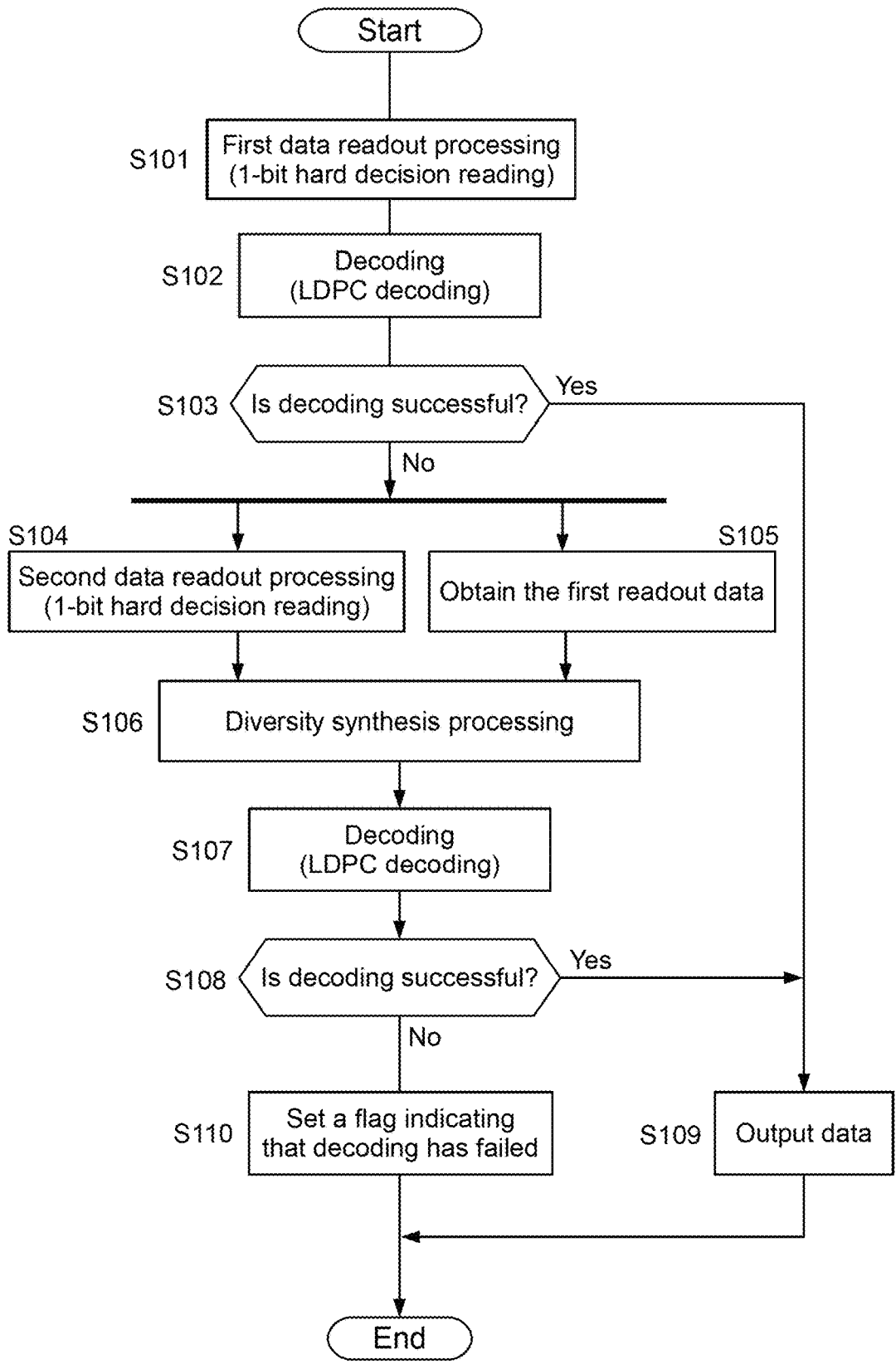
FIG. 2 is a flowchart of a data readout processing according to the first embodiment.

FIG. 2 is a flowchart of the data readout processing. In the following, the data readout processing will be described with reference to the flowchart of FIG. 2.

Step S101:

In step S101, the first data readout processing is performed.

The host device 1 transmits a read command to the memory controller MC.

The host interface unit IF21 obtains a read command (command Cmd) and transmits the obtained read command to the command control unit 21 and the control unit 27.

The command control unit 21 decodes the read command (command Cmd) and obtains a read logical address. Here, it is assumed that the read logical address is a logical address LAdr1. The command control unit 21 then transmits the data including the obtained information about the read logical address LAdr1 to the address translation unit 22 as the data D1_adr.

The address translation unit 22 converts the read logical address LAdr1 included in the input data D1_adr into a physical address PAdr1 based on the logical-address/physical-address translation table. The address translation unit 22 then transmits data including information about the physical address PAdr1 to the memory interface unit IF22 as data D2_adr.

The memory interface unit IF22 transmits the read address PAdr1 included in the data D2_adr transmitted from the address translation unit 22 to the non-volatile memory MEM.

Data is then read from the read address PAdr1 specified by the memory interface unit IF22 in the non-volatile memory MEM1. Note that the data is read in units of pages.

The non-volatile memory MEM1 starts the data readout processing and transmits the readout data (code data) D1_r to the memory interface unit IF22.

The memory interface unit IF22 obtains the readout data D1_r from the non-volatile memory MEM1, and transmits the obtained readout data D1_r as data D2_r to the diversity synthesis processing unit 24 and the data holding unit 25. The data holding unit 25 stores and holds the data D2_r. It is assumed that the data D1_r and D2_r are data for one page.

Steps S102, S103:

In step S102, the ECC decoding processing (LDPC decoding processing) is performed.

The control unit 27 recognizes that this is a first readout processing, generates a control signal Ctl3 instructing the diversity synthesis processing unit 24 to transmit the received readout data D2_r as the data D3_r to the ECC decoding unit 26 as it is, and then transmits the control signal Ctl3 to the diversity synthesis processing unit 24.

The diversity synthesis processing unit 24 transmits the received readout data D2_r as the data D3_r, as it is, to the ECC decoding unit 26 in accordance with the control signal Ctrl3.

The ECC decoding unit 26 performs the LDPC decoding processing on the data D3_r transmitted from the diversity synthesis processing unit 24. The ECC decoding unit 26 then determines whether the LDPC decoding has been successful (step S103). Specifically, the ECC decoding unit 26 repeatedly performs the LDPC decoding processing on data (binary data) of each bit of the data D3_r; (1) when a sufficient plausible decryption word is obtained within a predetermined number of repetitions, it is determined that the LDPC decoding processing for the data D3_r has been successful and (2) when a sufficient plausible decryption word is not obtained within a predetermined number of repetitions, it is determined that the LDPC decoding processing for the data D3_r has failed.

When the ECC decoding unit 26 determines that the LDPC decoding processing for the data D3_r has been successful, the process proceeds to a step S109, whereas when the ECC decoding unit 26 determines that the LDPC decoding processing for the data D3_r has failed, the process proceeds to steps S104 and S105.

Step S104:

In step S104, a second data readout processing is performed.

The control unit 27 generates a control signal Ctl1 for reading data on the same page as the page read in the first data readout processing, and transmits the control signal Ctl1 to the memory interface unit IF22.

The memory interface unit IF22 reads data on the same page as the page read in the first data readout processing in accordance with the control signal Ctrl1. In other words, the memory interface unit IF22 reads data from the physical address PAdr1 on the same page as the page read in the first data readout processing.

Note that the control unit 27 may generate the control signal Ctl1, referring to time-information of the timer 271, in a manner that the second data readout processing is performed after a predetermined time elapses (for example, after 150 ms elapses) from the time when the first data readout processing has been performed, and then may transmits the control signal Ctl1 to the memory interface unit IF22. As a result, in the non-volatile storage device 2, the second data readout processing can be performed after a predetermined time has elapsed from the time when the first data readout processing has been performed.

The non-volatile memory MEM1 starts the data readout processing and transmits the readout data (code data) D1_r to the memory interface unit IF22.

The memory interface unit IF22 obtains the readout data D1_r from the non-volatile memory MEM1, and transmits the obtained readout data D1_r as data D2_r to the diversity synthesis processing unit 24 and the data holding unit 25.

Step S105:

In step S105, a first readout data obtaining processing is performed. Specifically, the data holding unit 25 reads the first readout data that has been stored and held therein, and transmits the readout data as data D2h_r to the diversity synthesis processing unit 24.

Step S106:

In step S106, diversity synthesis processing is performed using the first readout data D2h_r transmitted from the data holding unit 25 and the second readout data D2_r. In other words, the diversity synthesis processing is performed using the data read from the same page of the non-volatile memory MEM1 for the first time and the second time.

Specifically, the diversity synthesis processing unit 24 performs the diversity synthesis processing by processing as follows.

Assuming that the readout data is N-bit (N is a natural number) data, the value of each bit is "0" or "1", and the j-th bit (j is an integer satisfying $1 \leq j \leq N$) of the data read out for the i-th time is $d_{i,j}$, the diversity synthesis processing unit 24 performs the processing corresponding to the following formula and obtains the LLR value LLR corresponding to the j-th bit of the readout data. In this embodiment, the number of readings is 2, so that m=2.

$$LLR_j = \frac{K}{m}\sum_{i=1}^{m}(d_{i,j}) - \frac{K}{2} + \text{c\_out} \quad \text{Formula 1}$$

$$\text{c\_out} = \begin{cases} c & \text{if } \frac{K}{m}\sum_{i=1}^{m}(d_{i,j}) \geq \frac{K}{2} \\ -c & \text{if } \frac{K}{m}\sum_{i=1}^{m}(d_{i,j}) < \frac{K}{2} \end{cases}$$

$d_{i,j} = \{0, 1\}$

K : Positive coefficient (gain)

c : Positive coefficient (offset)

The diversity synthesis processing unit 24 then performs the following process: (1) when the LLR value LLR corresponding to the j-th bit of the readout data obtained by the above process satisfies LLR 0, the diversity synthesis processing unit 24 sets the value of the j-th bit of the readout data after the diversity synthesis to "1", and (2) when the LLR value LLR corresponding to the j-th bit of the readout data obtained by the above process satisfies LLR<0, the diversity synthesis processing unit 24 sets the value of the j-th bit of the readout data after diversity synthesis processing to "0", thereby obtaining data (N-bit data) after diversity synthesis processing.

For example, when K=1 and c=1, the diversity synthesis processing unit 24 obtains the data after diversity synthesis processing as follows.

(1) When both of the j-th bit data read for the first time and the j-th bit data read for the second time are "1", $$LLR_j = (K/2) \times 2 - K/2 + c = K/2 + c = 0.5 + 1 = 1.5$$

is satisfied.

Since 1.5>0 is satisfied, the diversity synthesis processing unit 24 sets the value of the j-th bit of the readout data after diversity synthesis processing to "1".

(2) When the j-th bit data read for the first time is "0" and the j-th bit data read for the second time is "1", $$LLR_j = (K/2) \times 1 - K/2 + c = 0 + c = 1$$

is satisfied.

Since 1>0 is satisfied, the diversity synthesis processing unit 24 sets the value of the j-th bit of the readout data after diversity synthesis processing to "1".

(3) Assuming that K=1 and c=1, when both of the j-th bit data read for the first time and the j-th bit data read for the second time are "0", $$LLR_j = (K/2) \times 0 - K/2 - c = -K/2 - c = -0.5 - 1 = -1.5$$

is satisfied.

Since −1.5<0 is satisfied, the diversity synthesis processing unit 24 sets the value of the j-th bit of the readout data after diversity synthesis processing to "0".

Processing as described above causes the diversity synthesis processing unit 24 to obtain readout data after diversity synthesis processing from the first readout data D2h_r and the second readout data D2_r transmitted from the data holding unit 25.

Note that the reason for performing the diversity synthesis processing in the non-volatile storage device 2 in this way is as follows.

It is known that the number and position of error bits generated when reading data from a NAND flash memory is different even when each readout processing is performed on the same page. This phenomenon is especially noticeable when the readout interval time is relatively long. For example, when reading data from a page for the first time, then waiting a predetermined period of time (e.g., 150 ms), and then reading data from the page again, the number of error bits and the bit positions where errors occur are quite different when comparing the data read the first time and the data read the second time from the same page of NAND flash memory. This phenomenon indicates that there is diversity in the data read multiple times from the same page of NAND flash memory. Using this diversity improves the error correction strength. In other words, using the LLR obtained by the diversity synthesis of the data read multiple times from the same page of the NAND flash memory, data of a diversity synthesis word is obtained; and performing ECC decoding processing on the obtained data of the diversity synthesis word data allows for improving the error correction strength of readout data.

The readout data after diversity synthesis processing obtained as described above is transmitted as data D3_r from the diversity synthesis processing unit 24 to the ECC decoding unit 26.

Steps S107, S108:

In step S107, the ECC decoding processing (LDPC decoding processing) is performed.

The ECC decoding unit 26 performs LDPC decoding processing on the data D3_r transmitted from the diversity synthesis processing unit 24. The ECC decoding unit 26 then determines whether the LDPC decoding has been successful (step S108). Specifically, the ECC decoding unit 26 repeatedly performs the LDPC decoding processing on data (binary data) of each bit of the data D3_r; (1) when a sufficient plausible decryption word is obtained within a predetermined number of repetitions, it is determined that the LDPC decoding processing for the data D3_r has been successful and (2) when a sufficient plausible decryption word is not obtained within a predetermined number of repetitions, it is determined that the LDPC decoding processing for the data D3_r has failed.

When the ECC decoding unit 26 determines that the LDPC decoding processing for the data D3_r has been successful, the process proceeds to a step S109, whereas when the ECC decoding unit 26 determines that the LDPC decoding processing for the data D3_r has failed, the process proceeds to step S110.

Step S109:

In step S109, the host interface unit IF21 receives the data D4_r (data determined that the LDPC decoding processing has been successful) transmitted from the ECC decoding unit 26, generates the data DS1 including the data D4_r, and then transmits the the data DS1 to the host device 1.

The host device 1 receives the data DS1 transmitted from the host interface unit IF21, thereby allowing for obtaining readout data with high error correction strength.

Step S110:

In step S110, the ECC decoding unit 26 generates data indicating that the LDPC decoding processing has failed (for example, a flag indicating a decoding failure), and transmits the data (data indicating that the LDPC decoding processing has failed)) as data D4_r to the host interface unit IF21.

The host interface unit IF21 receives the data D4_r (data indicating that the LDPC decoding processing has failed) transmitted from the ECC decoding unit 26, generates the data DS1 including the data D4_r, and transmits the data DS1 to the host device 1.

The host device 1 receives the data DS1 transmitted from the host interface unit IF21, thereby recognizing that the reading of the data at the requested address has failed.

As described above, in the non-volatile storage system 1000, the error correction code decoding processing is performed on the data obtained by the diversity synthesis processing only when decoding using the conventional technique (hard-decision decoding processing) has failed. In other words, in the non-volatile storage system 1000, performing soft-decision processing with the diversity synthesis data only when decoding using the conventional technique (hard-decision decoding processing) has failed achieves both of the processing speed to be required and the error correction capability to be required. In other words, the non-volatile storage system 1000 can fine-tune the number of data readout times to the required minimum number of times depending on the required correction capability and processing speed, compared to the conventional technique, that is, the soft-decision decoding processing that is performed when decoding using the hard-decision decoding processing has failed, thereby allowing data readout processing to be performed with high efficiency and with a high speed.

Further, when the ECC decoding process using the first readout data has failed, the non-volatile storage system 1000 reads data on the same page again (performs the second data readout processing), performs diversity synthesis processing on the readout data for the first time and the readout data for the second time on the same page as one for the first time, and then performs error correction processing using data after diversity synthesis processing. There is a high possibility that the ECC decoding processing for the data after diversity synthesis processing will succeed; and therefore performing the process as described above in the non-volatile storage system 1000 improves the error correction capability. In other words, a plurality of pieces of data that has been read multiple times from the same page in the NAND flash memory have diversity in that the number of error bits and the bit position where the error occurs fluctuate, and therefore the data obtained by the synthesis processing has a high possibility that the error correction processing will succeed when the ECC decoding processing is performed. Thus, performing the ECC decoding processing for the data after diversity synthesis processing in the non-volatile storage system 1000 when the ECC decoding processing for the first readout data has failed improves the error correction capability.

As described above, the non-volatile storage system 1000 performs high-speed data readout processing while ensuring high error correction capability.

Note that it is preferable that the time between the first and second data readout processes for the same page is set to as long a time as possible within the time required to comply with the data readout time specified by a given standard (e.g., SD standard).

First Modification

Next, a first modification of the first embodiment will be described. The same parts as those in the above embodiment are designated by the same reference numerals, and detailed description thereof will be omitted.

In the first embodiment, the number of times the data is read from the same page is two, but in this modification, the data readout processing from the same page is repeated until the ECC decoding processing is successful. This point is different between this modification and the first embodiment.

Figure 3:
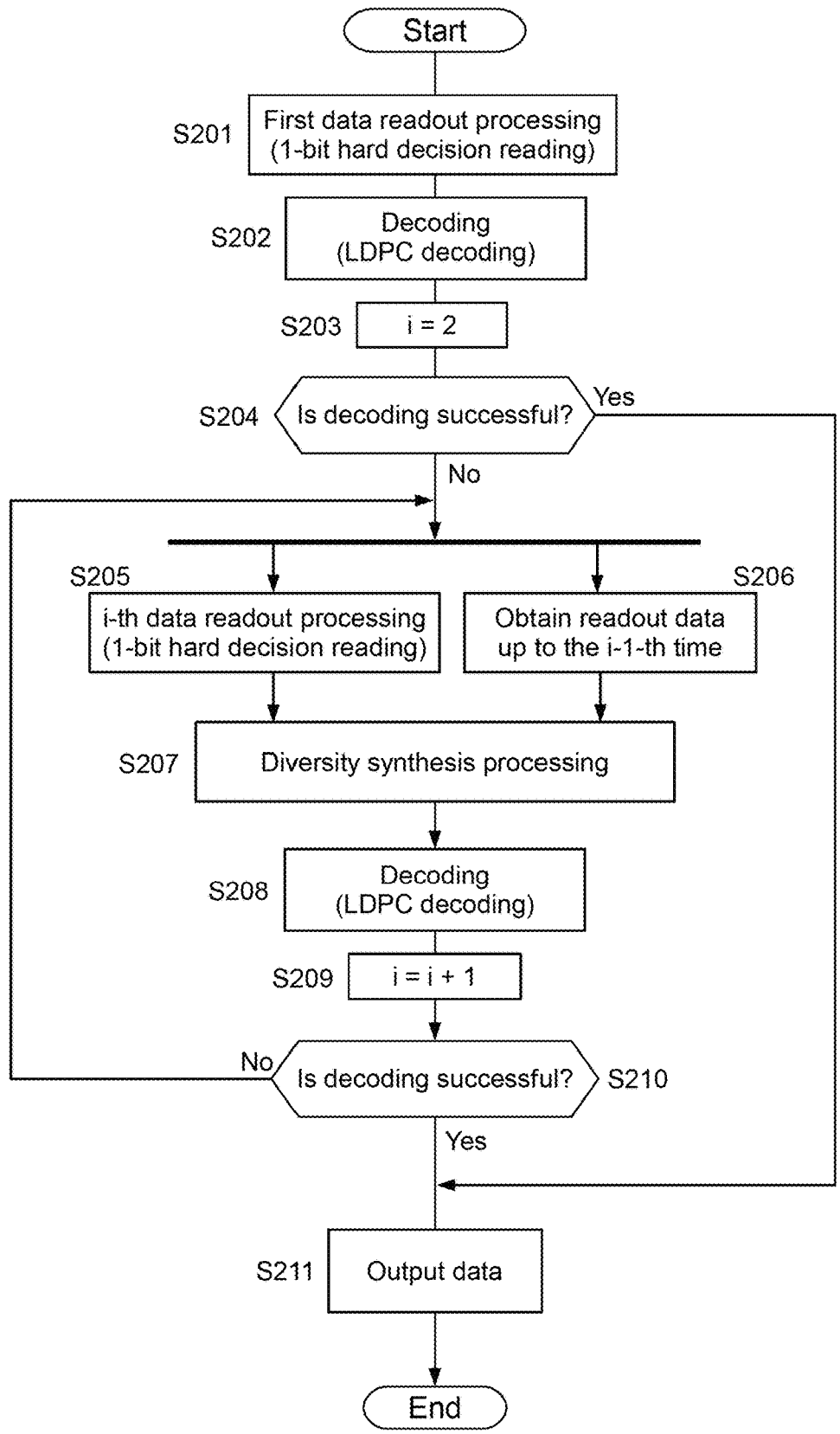
FIG. 3 is a flowchart of data readout processing of a first modification of the first embodiment.

FIG. 3 is a flowchart of the data readout processing of the first modification. Hereinafter, the data readout processing will be described with reference to the flowchart of FIG. 3.

Steps 201 to S204:

In steps S201, S202, and S204, the same processes as in the steps S101, S102, and S103 of the first embodiment are performed, respectively.

In step S203, the variable i is set to "2".

Steps S205 to S210:

<<Processing for the Second Readout Data>>

In steps S205 to S208, the processing for the second readout data is performed. In other words, in steps S205 to S208, the same processing as in the steps S104 to S107 of the first embodiment is performed, respectively. Further, in step S209, the variable i is incremented by 1.

In step S208, the ECC decoding processing (LDPC decoding processing) is performed.

The ECC decoding unit 26 performs the LDPC decoding processing on the data D3_r transmitted from the diversity synthesis processing unit 24. The ECC decoding unit 26 then determines whether the LDPC decoding has been successful (step S210). Specifically, the ECC decoding unit 26 repeatedly performs the LDPC decoding process on data (binary data) of each bit of the data D3_r; (1) when a sufficient plausible decryption word is obtained within a predetermined number of repetitions, it is determined that the LDPC decoding processing for the data D3_r has been successful and (2) when a sufficient plausible decryption word is not obtained within a predetermined number of repetitions, it is determined that the LDPC decoding processing for the data D3_r has failed.

When the ECC decoding unit 26 determines that the LDPC decoding processing for the data D3_r has been successful, the process proceeds to a step S211, whereas when the ECC decoding unit 26 determines that the LDPC decoding processing for the data D3_r has failed, the process returns to steps S205 and S206.

<<Processing for the Third Readout Data>>

If it is determined in step S210 that the LDPC decoding processing for the data D3_r has failed, the third (i=3) data readout processing is performed.

In the processing for the third (i=3) data readout, in step S205, the control unit 27 generates a control signal Ctrl1 for reading data on the same page as the page for the first and second data readout processes in step S205, and then transmits the control signal Ctrl1 to the memory interface unit IF22.

The memory interface unit IF22 reads data on the same page as the page for the first data readout processing and the second data readout processing in accordance with the control signal Ctrl1. In other words, the memory interface unit IF22 reads data from the physical address PAdr1 on the same page as the page for the first data readout processing.

Note that the control unit 27 may generate the control signal Ctrl1, referring to time-information of the timer 271, in a manner that the third data readout processing is performed after a predetermined time elapses (for example, after 150 ms elapses) from the time when the second data readout processing has been performed, and then may transmits the control signal Ctrl1 to the memory interface unit IF22. As a result, in the non-volatile storage device 2, the third data readout processing can be performed after a predetermined time has elapsed from the time when the second data readout processing has been performed.

The non-volatile memory MEM1 starts the data readout processing and transmits the readout data (code data) D1_r to the memory interface unit IF22.

The memory interface unit IF22 obtains the readout data D1_r from the non-volatile memory MEM1, and transmits the obtained readout data D1_r as data D2_r to the diversity synthesis processing unit 24 and the data holding unit 25.

In step S206, processing for obtaining the second readout data (the first readout data and the second readout data) is performed. Specifically, the data holding unit 25 reads the first readout data that has been stored and held therein and the second readout data, and transmits the readout data as data D2h_r (two pieces of readout data for two times) to diversity synthesis processing unit 24.

In step S207, the diversity synthesis processing is performed using the first and second readout data (data D2h_r) transmitted from the data holding unit 25 and the third readout data D2_r. In other words, the diversity synthesis processing is performed using three pieces of data each of which has been read from the same page in the non-volatile memory MEM1 for the first to third times.

Specifically, the diversity synthesis processing unit 24 performs the diversity synthesis processing by processing as follows.

Assuming that the readout data is N-bit (N is a natural number) data, the value of each bit is "0" or "1", and the j-th bit (j is an integer satisfying) of the data read out for the i-th time is $d_{i,j}$, the diversity synthesis processing unit 24 performs the processing corresponding to the following formula and obtains the LLR value LLR corresponding to the j-th bit of the readout data. In this embodiment, the number of readings is three, so that m=3.

$$LLR_j = \frac{K}{m}\sum_{i=1}^{m}(d_{i,j}) - \frac{K}{2} + c\_out \qquad \text{Formula 2}$$

$$c\_out = \begin{cases} c & \text{if } \frac{K}{m}\sum_{i=1}^{m}(d_{i,j}) \geq \frac{K}{2} \\ -c & \text{if } \frac{K}{m}\sum_{i=1}^{m}(d_{i,j}) < \frac{K}{2} \end{cases}$$

$$d_{i,j} = \{0, 1\}$$

$K$ : Positive coefficient (gain)

$c$ : Positive coefficient (offset)

The diversity synthesis processing unit 24 then performs the following process: (1) when the LLR value LLR corresponding to the j-th bit of the readout data obtained by the above process satisfies LLR 0, the diversity synthesis processing unit 24 sets the value of the j-th bit of the readout data after the diversity synthesis processing to "1", and (2) when the LLR value LLR corresponding to the j-th bit of the readout data obtained by the above process satisfies LLR<0, the diversity synthesis processing unit 24 sets the value of the j-th bit of the readout data after diversity synthesis processing to "0", thereby obtaining data (N-bit data) after diversity synthesis processing.

The readout data after diversity synthesis processing obtained as described above is transmitted as data D3_r from the diversity synthesis processing unit 24 to the ECC decoding unit 26.

In step S208, the ECC decoding processing (LDPC decoding processing) is performed.

The ECC decoding unit 26 performs the LDPC decoding processing on the data D3_r transmitted from the diversity synthesis processing unit 24. The ECC decoding unit 26 then determines whether the LDPC decoding has been successful (step S210). Specifically, the ECC decoding unit 26 repeatedly performs the LDPC decoding processing on data (binary data) of each bit of the data D3_r; (1) when a sufficient plausible decryption word is obtained within a predetermined number of repetitions, it is determined that the LDPC decoding processing for the data D3_r has been successful and (2) when a sufficient plausible decryption word is not obtained within a predetermined number of repetitions, it is determined that the LDPC decoding processing for the data D3_r has failed.

When the ECC decoding unit 26 determines that the LDPC decoding processing for the data D3_r has been successful, the process proceeds to a step S211, whereas when the ECC decoding unit 26 determines that the LDPC decoding processing for the data D3_r has failed, the variable i is incremented by 1 and then the process returns to steps S205 and S206. In this case, the data readout processing for the fourth time (i=4) is then performed in the same manner as described above.

In this way, the non-volatile storage device 2 repeats the data readout processing from the same page until the decoding processing succeeds.

Step S211:

In step S211 the host interface unit IF21 receives the data D4_r (data determined that the LDPC decoding processing has been successful) transmitted from the ECC decoding unit 26, generates data DS1 including the data D4_r, and then transmits the data DS1 to the host device 1.

The host device 1 receives the data DS1 transmitted from the host interface unit IF21, thereby obtaining readout data with high error correction strength.

As described above, in the non-volatile storage system of the present modification, the error correction code decoding processing is performed on the data obtained by the diversity synthesis processing only when decoding using the conventional technique (hard-decision decoding processing) has failed. In other words, in the non-volatile storage system of the present modification, performing soft-decision processing with the diversity synthesis data only when decoding using the conventional technique (hard-decision decoding processing) has failed achieves both of the processing speed to be required and the error correction capability to be required. In other words, the non-volatile storage system of the present modification can fine-tune the number of data readout times to the required minimum number of times depending on the required correction capability and processing speed, compared to the conventional technique, that is, the soft-decision decoding processing that is performed when decoding using the hard-decision decoding processing has failed, thereby allowing data readout processing to be performed with high efficiency and with a high speed.

Further, the non-volatile storage system of the present modification performs ECC decoding processing using data obtained by diversity synthesis processing of the data read multiple times from the same page until the decoding processing has been successful, thereby improving the error correction capability.

As described above, the non-volatile storage system of the present modification performs high-speed data readout processing while ensuring high error correction capability.

Note that it is preferable that the time between the i-th and i+1-th data readout processes for the same page is set to as long a time as possible within the time required to comply with the data readout time specified by a given standard (e.g., SD standard). Further, the time between the i-th data readout processing and the i+1-th data readout processing may be a fixed time or a variable time.

Second Modification

Next, a second modification of the first embodiment will be described. The same parts as those in the above-described embodiment and modification are designated by the same reference numerals, and detailed description thereof will be omitted.

Figure 4:
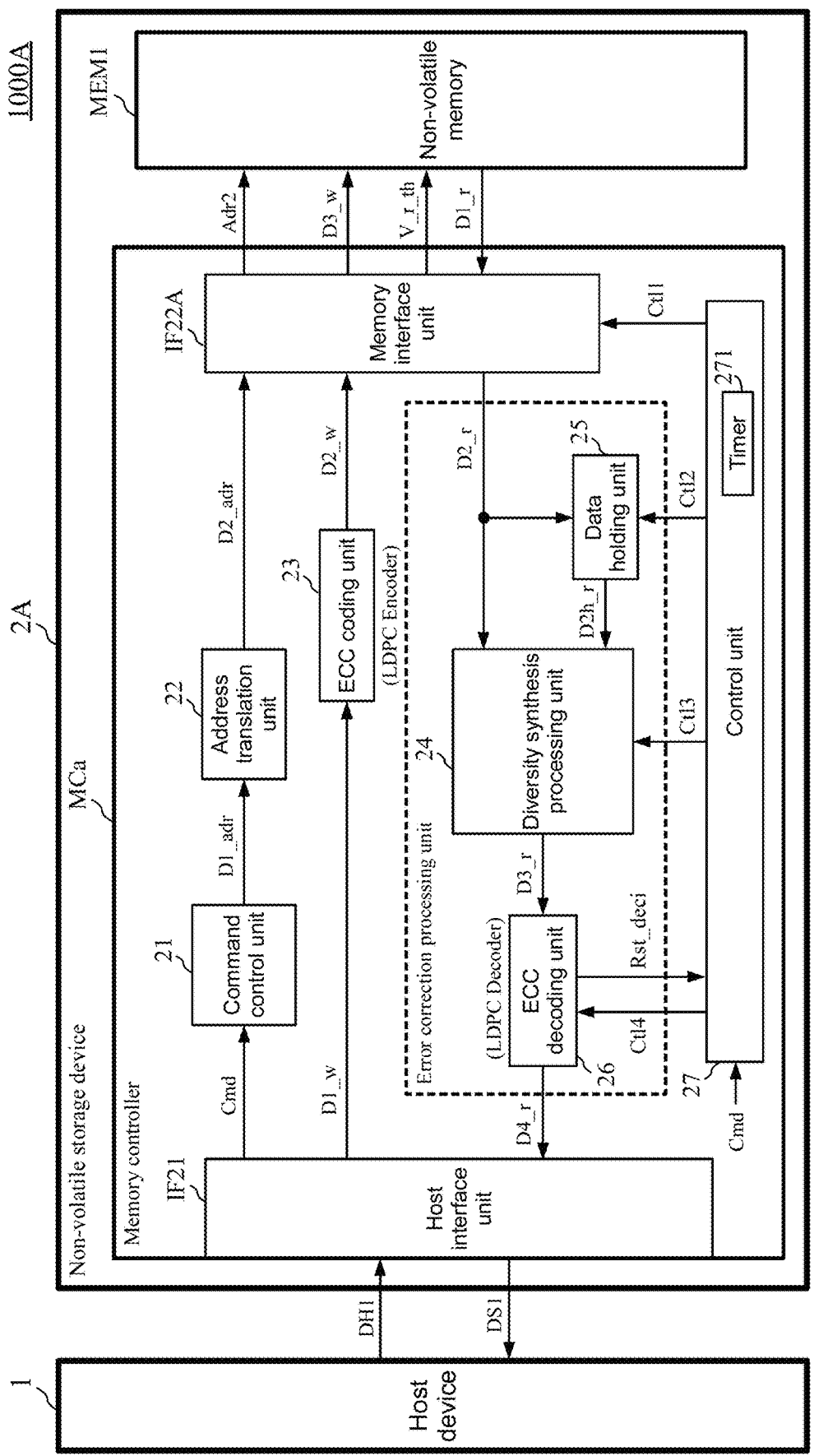
FIG. 4 is a schematic configuration diagram of a non-volatile storage system 1000A according to a second modification of the first embodiment.

FIG. 4 is a schematic configuration diagram of the non-volatile storage system 1000A according to the second modification of the first embodiment.

Figure 5:
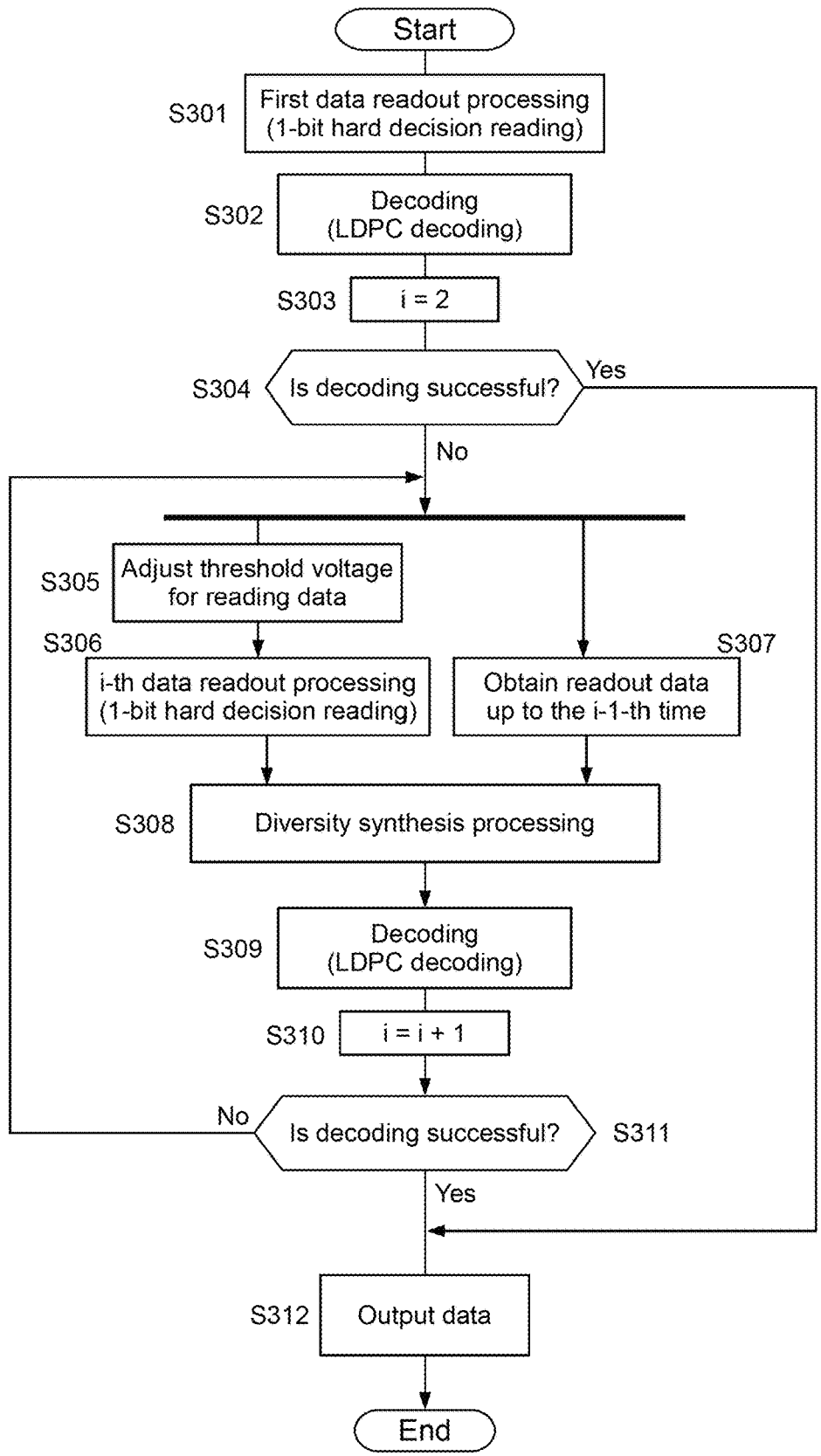
FIG. 5 is a flowchart of data readout processing in the non-volatile storage system 1000A according to a second modification of the first embodiment.

FIG. 5 is a flowchart of data readout processing in the non-volatile storage system 1000A according to the second modification of the first embodiment.

The non-volatile storage system 1000A of this modification has a configuration in which the non-volatile storage device 2 is replaced with the non-volatile storage device 2A in the non-volatile storage system 1000 of the first embodiment. The non-volatile storage device 2A has a configuration in which the memory controller MC is replaced with the memory controller MCa and the memory interface unit IF22 is replaced with the memory interface unit IF22A in the non-volatile storage device 2 of the first embodiment. Other than that, the non-volatile storage system 1000A of this modification is the same as the non-volatile storage system 1000 of the first embodiment.

The memory interface unit IF22A can change the threshold voltage at the time of reading data in addition to the same function as the memory interface unit IF22. In other words, the memory interface unit IF22A can change the voltage (threshold voltage) when reading data for each memory cell in the non-volatile memory MEM1. Specifically, the memory interface unit IF22A outputs the threshold voltage V_r_th to the non-volatile memory MEM1, and in the non-volatile memory MEM1, data from each memory cell is read out using the threshold voltage V_r_th.

The data readout processing of the non-volatile storage system 1000A configured as described above will be described with reference to the flowchart of FIG. 5.

In the data readout processing of the non-volatile storage system 1000A of the present modification, processing for adjusting a threshold voltage (step S305) for data readout processing is added before the i-th data readout processing in the data read processing in the non-volatile storage system of the first modification of the first embodiment. This point is the difference between the data readout processing of the non-volatile storage system 1000A of the present modification and the data readout processing of the non-volatile storage system of the first modification of the first embodiment; other than that, the data read processing of the non-volatile storage system 1000A of the present modification is the same as the data readout processing of the non-volatile storage system of the first modification of the first embodiment. This difference will be described below.

Step S305:

In step S305, the control unit 27 generates a control signal Ctrl1 instructing the non-volatile memory MEM1 to set a threshold voltage (threshold voltage) when reading data for each memory cell to a threshold voltage V_r_th, and then transmits the generated control signal Ctrl1 to the memory interface unit IF22A.

The memory interface unit IF22A sets the threshold voltage to V_r_th in accordance with the control signal Ctrl1. The memory interface unit IF22A outputs the threshold voltage V_r_th to the non-volatile memory MEM1, and then the non-volatile memory MEM1 reads data from each memory cell using the threshold voltage V_r_th.

Here, the reason for changing the threshold voltage when reading data from each memory cell of the non-volatile memory MEM1 will be described with reference to FIG. 6.

FIG. 6 is a graph showing the relationship between the voltage applied at the time of reading data and the probability density in each cell of the non-volatile memory MEM1 (NAND flash memory).

Figure 6A:
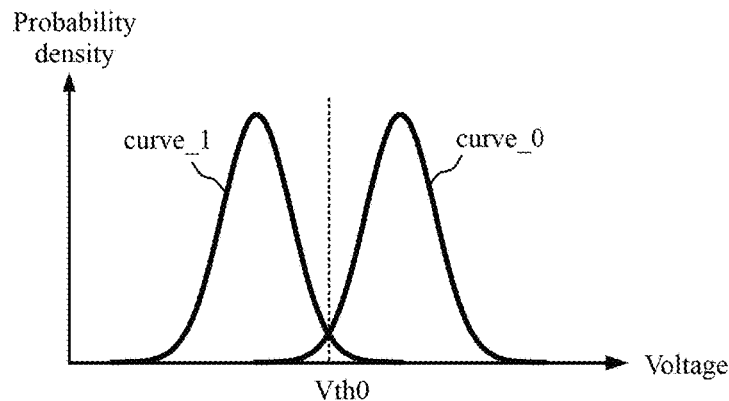
FIGS. 6A-6C are graphs each showing the relationship between the voltage applied when reading data and the probability density in each cell of the non-volatile memory MEM1 (NAND flash memory).

FIG. 6A is a graph showing the relationship between the voltage applied at the time of reading data and the probability density in each cell of the non-volatile memory MEM1 (NAND flash memory) in a normal state (when there is no influence of read disturbance or data retention). In FIG. 6A, the curve Curve_1 is a curve indicating the probability density that the value of the data stored in each memory cell is "1", and the curve Curve_1 is a curve indicating the probability density that the value of the data stored in each memory cell is "0".

Figure 6B:
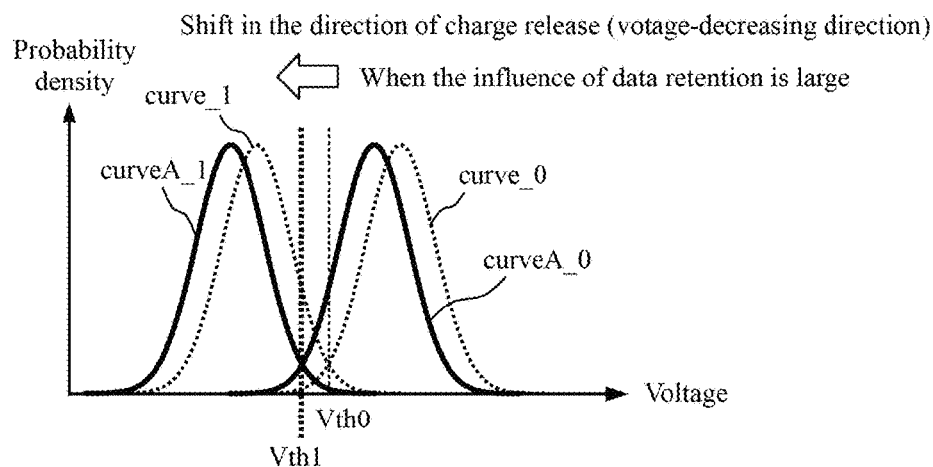

FIG. 6B is a graph showing the relationship between the voltage applied at the time of reading data and the probability density in each cell of the non-volatile memory MEM1 (NAND flash memory) when the influence of data retention is large. In FIG. 6B, the curve CurveA_1 is a curve indicating the probability density that the value of the data stored in each memory cell is "1" when the influence of the data retention is large, and the curve CurveA_1 is a curve indicating the probability density that the value of the data stored in each memory cell is "0" when the influence of the data retention is large.

Figure 6C:
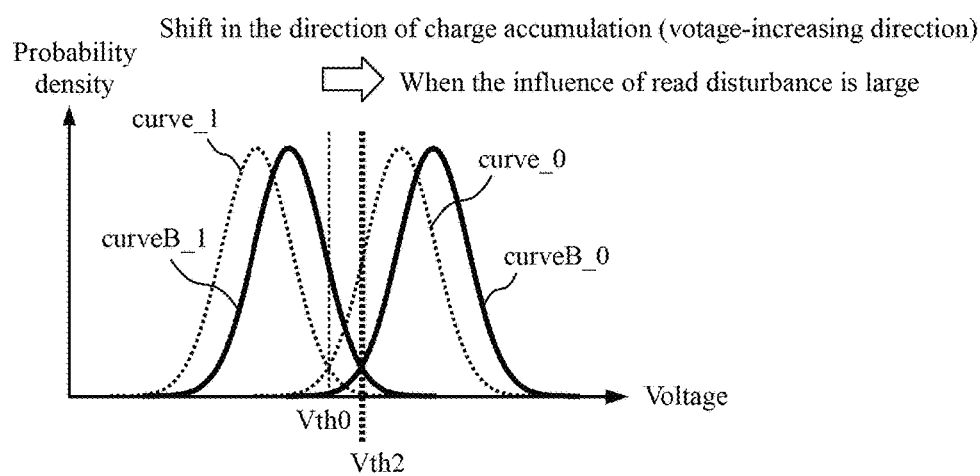

FIG. 6C is a graph showing the relationship between the voltage applied at the time of reading data and the probability density in each cell of the non-volatile memory MEM1 (NAND flash memory) when the influence of read disturbance is large. In FIG. 6C, the curve CurveB_1 is a curve showing the probability density that the value of the data stored in each memory cell when the influence of the read disturbance is large is "1", and the curve CurveB_1 is a curve showing the probability density that the value of the data stored in each memory cell is "0" when the influence of the read disturbance is large.

It turns out that, as shown in FIG. 6A, setting the threshold voltage at the time of data reading to Vth0 in the non-volatile memory MEM1 (NAND flash memory) under normal conditions causes the probability that data is read correctly to become higher.

In contrast to that, it turns out that, as shown in FIG. 6B, setting the threshold voltage at the time of data reading to Vth0 in the non-volatile memory MEM1 (NAND flash memory) when the influence of data retention is large causes the probability that data is read correctly to become lower. In general, a state in which the influence of data retention is large is a certain state in which the data write/read processing for the non-volatile memory MEM1 has not been performed for a long period of time, and the electric charge to be retained tends to flow out from the tunnel oxide film in each memory cell. Thus, in this case, a curve showing the probability density that the value of the data stored in each memory cell is "1", and a curve showing the probability density that the value of the data stored in each memory cell is "0" both tend to exhibit the characteristic of shifting voltages toward the lower voltage region. As a result, when the non-volatile memory MEM1 (NAND flash memory) is in a state where the influence of data retention is large, setting the threshold voltage at the time of reading data to Vth1 as shown in FIG. 6B increases the possibility that data is read correctly compared with setting the threshold voltage at the time of reading data to Vth0.

Further, it turns out that, as shown in FIG. 6C, setting the threshold voltage at the time of data reading to Vth0 in the non-volatile memory MEM1 (NAND flash memory) when the influence of read disturbance is large causes the probability that data is read correctly to become lower. In general, a state in which the influence of the read disturbance is large is a state in which the number of times of reading data from a specific memory cell is large in the non-volatile memory MEM1 and the state of the electric charge to be retained in the memory cell is not appropriate. In other words, when the influence of the read disturbance is large, the memory cell tends to retain more charge than the charge to be retained in the memory cell, which is similar to the weak write characteristic. Thus, in this case, a curve showing the probability density that the value of the data stored in each memory cell is "1", and a curve showing the probability density that the value of the data stored in each memory cell is "0" both tend to exhibit the characteristic of shifting voltages toward the higher voltage region. As a result, when the non-volatile memory MEM1 (NAND flash memory) is in a state where the influence of read disturbance is large, setting the threshold voltage at the time of reading data to Vth2 as shown in FIG. 6C increases the possibility that data is read correctly compared with setting the threshold voltage at the time of reading data to Vth0.

In this way, considering the characteristics of the non-volatile memory MEM1 (NAND flash memory), adjusting the threshold voltage when reading the data of the non-volatile memory MEM1 when readout data cannot be decoded correctly causes the probability that correct data is obtained to become higher.

Thus, the non-volatile storage system 1000A of the present modification adjusts the threshold voltage for reading data before the i-th data readout processing is performed (step S305).

Note that for example, when it can be determined that the data read/write processing for the non-volatile memory MEM1 has not been performed for a long period of time and the influence of the data retention is large in the non-volatile storage device 2A, it is preferable, in step S305, to adjust the read threshold voltage V_r_th to be lower than the threshold voltage Vth0 at the time of reading data in the normal state.

Further, in the non-volatile storage device 2A, for example, when information about the number of times data has been read from each memory cell is known, and the state of the memory cell targeted for data readout processing is determined, based on the information, to be a state in which the influence of the read disturbance is large, it is preferable to adjust the threshold voltage V_r_th for reading data to be higher than the threshold voltage Vth0 at the time of reading data in the normal state in step S305.

Note that even when (1) information on whether the influence of data retention is large regarding the non-volatile memory MEM1 and (2) information on whether the influence of read disturbance is large regarding the non-volatile memory MEM1 cannot be obtained in the non-volatile storage device 2A, the non-volatile storage system 1000A of the present modification performs diversity synthesis processing using readout data obtained by changing the threshold voltage V_r_th (for example, randomly within a predetermined range) at the time of reading data and then performs the error correction processing, thereby allowing for performing the error correction processing with high accuracy. In other words, the non-volatile storage system 1000A performs diversity synthesis processing using readout data obtained by changing the threshold voltage V_r_th (for example, randomly within a predetermined range) at the time of reading data, thereby allowing for obtaining readout data with the influence on the non-volatile memory MEM1 (the influence of data retention, the influence of read disturbance, and the like) lowered; furthermore, performing error correction processing on the readout data obtained as described above achieves error correction processing for the readout data with higher accuracy.

As a result, for example, even when a non-volatile storage device used for a ROM application of a game employs a device in which (1) the number of times data has been read (read disturbance) and (2) the leaving time (data retention)

are unknown, the high error correction capability and high-speed processing (high throughput) is achieved.

Third Modification

Next, a third modification of the first embodiment will be described. The same parts as those in the above-described embodiment and modifications are designated by the same reference numerals, and detailed description thereof will be omitted.

Figure 7:
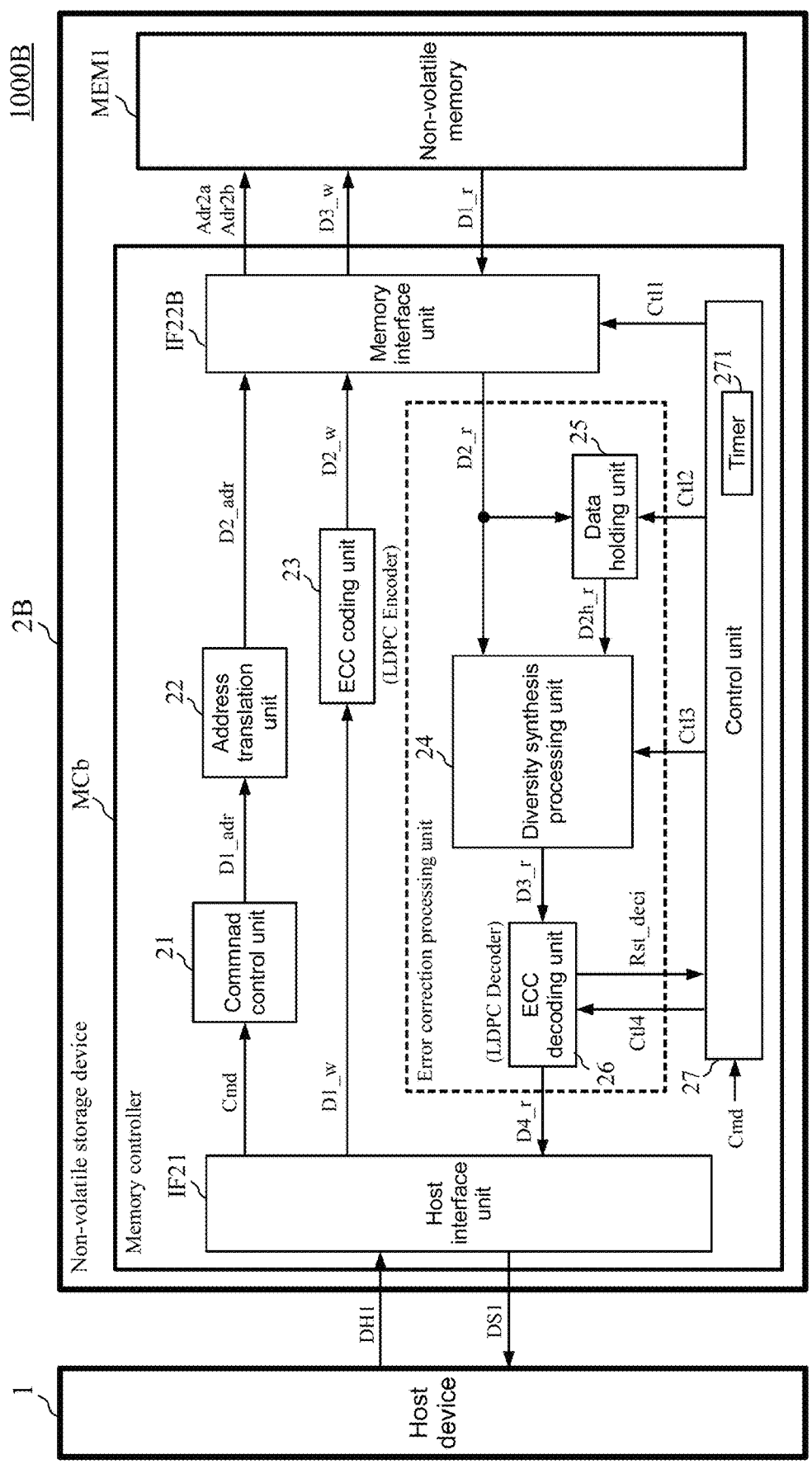
FIG. 7 is a schematic configuration diagram of a non-volatile storage system 1000B according to a third modification of the first embodiment.

FIG. 7 is a schematic configuration diagram of the non-volatile storage system 1000B according to the third modification of the first embodiment.

Figure 8:
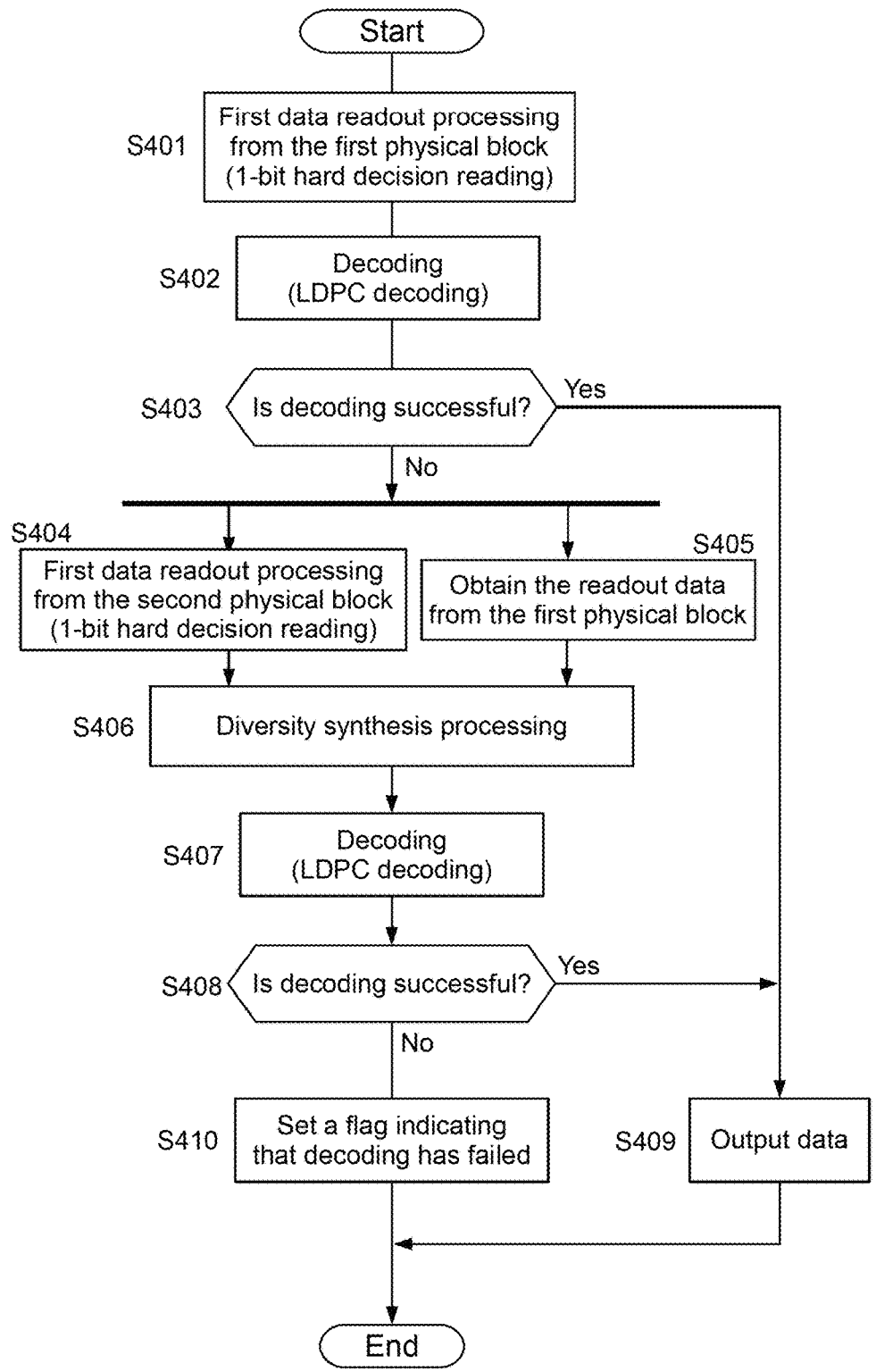
FIG. 8 is a flowchart of data readout processing in the non-volatile storage system 1000B according to the third modification of the first embodiment.

FIG. 8 is a flowchart of data readout processing in the non-volatile storage system 1000B according to the third modification of the first embodiment.

The non-volatile storage system 1000B of the present modification has a configuration in which the non-volatile storage device 2 is replaced with the non-volatile storage device 2A in the non-volatile storage system 1000 of the first embodiment. The non-volatile storage device 2A has a configuration in which the memory controller MC is replaced with the memory controller MCb and the memory interface unit IF22 is replaced with the memory interface unit IF22B in the non-volatile storage device 2 of the first embodiment. Other than that, the non-volatile storage system 1000B of this modification is the same as the non-volatile storage system 1000 of the first embodiment.

The memory interface unit IF22B has the same function as the memory interface unit IF22, and additionally has a function in which when the same data has been written in different physical blocks of the non-volatile memory MEM1, the memory interface unit IF22B reads data from the different physical blocks (the physical addresses for the different physical blocks are referred to as Dr2a and Adr2b) of the non-volatile memory MEM1 where the same data has been written.

The data readout processing of the non-volatile storage system 1000B configured as described above will be described with reference to the flowchart of FIG. 8. For convenience of explanation, it is assumed that the same data has been stored in a page in which the physical address of the first physical block is Dr2a and a page in which the physical address of the second physical block is Dr2b. It is assumed that the first physical block is a physical block different from the second physical block.

Step S401:

In step S401, the data readout processing from the page where the physical address of the first physical block is Dr2b is performed.

The host device 1 transmits a read command to the memory controller MC.

The host interface unit IF21 obtains the read command (command Cmd) and transmits the obtained read command to the command control unit 21 and the control unit 27.

The command control unit 21 decodes the read command (command Cmd) to obtain the read logical address. Here, it is assumed that the read logical address is the logical address LAdr1. The command control unit 21 then transmits the data including the obtained information about the read logical address LAdr1 as the data D1_adr to the address translation unit 22.

The address translation unit 22 converts the read logical address LAdr1 included in the received data D1_adr into the physical address PAdr1 (=Adr2a) based on the logical address/physical address translation table. The address translation unit 22 then transmits data including information about the physical address PAdr1 (=Adr2a) to the memory interface unit IF22 as data D2_adr.

The memory interface unit IF22 transmits the read address PAdr1 (=Adr2a) included in the data D2_adr transmitted from the address translation unit 22 to the non-volatile memory MEM1.

The non-volatile memory MEM1 then reads data from the read address PAdr1 (=Adr2a) designated by the memory interface unit IF22. The data is read in units of pages.

The non-volatile memory MEM1 starts the data readout processing and transmits the readout data (code data) D1_r to the memory interface unit IF22.

The memory interface unit IF22 obtains the readout data D1_r from the non-volatile memory MEM1, and transmits the obtained readout data D1_r as data D2_r to the diversity synthesis processing unit 24 and the data holding unit 25. The data holding unit 25 stores and holds the data D2_r. It is assumed that the data D1_r and D2_r are data for one page.

Steps S402, S403:

In step S402, the ECC decoding processing (LDPC decoding processing) is performed.

The control unit 27 recognizes that it is the first readout processing for the data read from the page where the physical address of the first physical block is Adr2a, generates a control signal Ctl3 instructing diversity synthesis processing unit 24 to transmit the received readout data D2_r as data D3_r to the ECC decoding unit 26, and then transmits the control signal Ctl3 to the diversity synthesis processing unit 24.

The diversity synthesis processing unit 24 transmits the received readout data D2_r as the data D3_r to the ECC decoding unit 26 in accordance with the control signal Ctrl3.

The ECC decoding unit 26 performs the LDPC decoding processing on the data D3_r transmitted from the diversity synthesis processing unit 24. The ECC decoding unit 26 then determines whether the LDPC decoding has been successful (step S403).

When the ECC decoding unit 26 determines that the LDPC decoding processing for the data D3_r has been successful, the process proceeds to step S409, whereas when the ECC decoding unit 26 determines that the LDPC decoding process for the data D3_r has failed, the process proceeds to steps S404 and S405.

Step S404:

In step S404, the data readout processing from the page where the physical address of the second physical block is Dr2b is performed.

The control unit 27 generates a control signal Ctl1 for reading the data of the page whose physical address is Dr2b, and transmits the control signal Ctl1 to the memory interface unit IF22.

The memory interface unit IF22 reads data from the page where the physical address of the second physical block is Dr2b in accordance with the control signal Ctrl1.

The non-volatile memory MEM1 starts the data readout processing and transmits the readout data (code data) D1_r to the memory interface unit IF22.

The memory interface unit IF22 obtains the readout data D1_r from the non-volatile memory MEM1, and transmits the obtained readout data D1_r as data D2_r to the diversity synthesis processing unit 24 and the data holding unit 25.

Step S405:

In step S405, the data holding unit 25 obtains the data read from the page in which the physical address of the first physical block stored and held therein is Adr2a, and then transmits the obtained data as data D2h_r to the diversity synthesis processing unit 24.

Step S406:

In step S406, using the data D2h_r (data read from the page where the physical address of the first physical block is Dr2a) transmitted from the data holding unit 25 and the data D2_r (the page where the physical address of the second physical block is Dr2b), the diversity synthesis processing is performed.

Specifically, the diversity synthesis processing unit 24 performs the diversity synthesis processing by processing as follows.

Assuming that the readout data is N-bit (N is a natural number) data, the value of each bit is "0" or "1", and the j-th bit (j is an integer satisfying 1≤j≤N) of the data read from the i-th physical block is $d_{i,j}$, the diversity synthesis processing unit 24 performs the processing corresponding to the following formula and obtains the LLR value LLR corresponding to the j-th bit of the readout data. In this embodiment, since there are two physical blocks from which data has been read, m=2.

$$LLR_j = \frac{K}{m}\sum_{i=1}^{m}(d_{i,j}) - \frac{K}{2} + c\_out \quad \text{Formula 3}$$

$$c\_out = \begin{cases} c & \text{if } \frac{K}{m}\sum_{i=1}^{m}(d_{i,j}) \geq \frac{K}{2} \\ -c & \text{if } \frac{K}{m}\sum_{i=1}^{m}(d_{i,j}) < \frac{K}{2} \end{cases}$$

$d_{i,j} = \{0, 1\}$ $K$ : Positive coefficient (gain)

$c$ : Positive coefficient (offset)

The diversity synthesis processing unit 24 then performs the following process: (1) when the LLR value LLR corresponding to the j-th bit of the readout data obtained by the above process satisfies $LLR_j \geq 0$, the diversity synthesis processing unit 24 sets the value of the j-th bit of the readout data after the diversity synthesis processing to "1", and (2) when the LLR value LLR corresponding to the j-th bit of the readout data obtained by the above process satisfies LLR<0, the diversity synthesis processing unit 24 sets the value of the j-th bit of the readout data after diversity synthesis processing to "0", thereby obtaining data (N-bit data) after diversity synthesis processing.

By processing as described above, the diversity synthesis processing unit 24 obtains readout data after diversity synthesis processing from the data D2h_r (data read from the page where the physical address of the first physical block is Adr2a) and the data D2_r (data read from the page where the physical address of the second physical block is Adr2b).

The readout data after diversity synthesis processing obtained as described above is transmitted as data D3_r from the diversity synthesis processing unit 24 to the ECC decoding unit 26.

Steps S407, S408:

In step S407, the ECC decoding processing (LDPC decoding processing) is performed.

The ECC decoding unit 26 performs the LDPC decoding processing on the data D3_r transmitted from the diversity synthesis processing unit 24. The ECC decoding unit 26 then determines whether the LDPC decoding has been successful (step S408). Specifically, the ECC decoding unit 26 repeatedly performs the LDPC decoding processing on data (binary data) of each bit of the data D3_r; (1) when a sufficient plausible decryption word is obtained within a predetermined number of repetitions, it is determined that the LDPC decoding processing for the data D3_r has been successful and (2) when a sufficient plausible decryption word is not obtained within a predetermined number of repetitions, it is determined that the LDPC decoding processing for the data D3_r has failed.

When the ECC decoding unit 26 determines that the LDPC decoding processing for the data D3_r has been successful, the process proceeds to a step S409, whereas when the ECC decoding unit 26 determines that the LDPC decoding processing for the data D3_r has failed, the process proceeds to step S410.

Step S409:

In step S409, the host interface unit IF21 receives the data D4_r (data determined that the LDPC decoding processing has been successful) transmitted from the ECC decoding unit 26, generates the data DS1 including the data D4_r, and transmits the data DS1 to the host device 1.

The host device 1 receives the data DS1 transmitted from the host interface unit IF21, thereby allowing for obtaining readout data having with error correction strength.

Step S410:

In step S410, the ECC decoding unit 26 generates data indicating that the LDPC decoding processing has failed (for example, a flag indicating a decoding failure), and transmits the data (data indicating that the LDPC decoding processing has failed)) as data D4_r to the host interface unit IF21.

The host interface unit IF21 receives the data D4_r (data indicating that the LDPC decoding processing has failed) transmitted from the ECC decoding unit 26, generates the data DS1 including the data D4_r, and transmits the data DS1 to the host device 1.

The host device 1 receives the data DS1 transmitted from the host interface unit IF21, thereby recognizing that the reading of the data at the requested address has failed.

As described above, in the non-volatile storage system 1000B, the error correction code decoding processing is performed on the data obtained by the diversity synthesis processing only when decoding using the conventional technique (hard-decision decoding processing) has failed. In other words, in the non-volatile storage system 1000B, performing soft-decision processing with the diversity synthesis data only when decoding using the conventional technique (hard-decision decoding processing) has failed achieves both of the processing speed to be required and the error correction capability to be required. In other words, the non-volatile storage system 1000B can fine-tune the number of data readout times to the required minimum number of times depending on the required correction capability and processing speed, compared to the conventional technique, that is, the soft-decision decoding processing that is performed when decoding using the hard-decision decoding processing has failed, thereby allowing data readout processing to be performed with high efficiency and with a high speed.

Further, when the ECC decoding processing using the first readout data (data read from the first physical block) has failed, the non-volatile storage system 1000B reads data again from the second physical block where the same data has been stored, performs diversity synthesis processing on two pieces of data that have been read from different physical blocks in which the same data has been stored, performs the diversity synthesis processing, and then performs error correction processing using data after diversity synthesis processing. Since the error occurrence states are different in different physical blocks, a possibility that the ECC decoding processing for the data after diversity synthesis processing will succeed become higher. Thus, the non-volatile storage system 1000B performs the processing as described above, thereby improving the error correction capability.

As described above, the non-volatile storage system 1000B performs high-speed data readout processing while ensuring high error correction capability.

In the above, a case where the same data has been written in different physical blocks has been described, but the present invention should not be limited to this; for example, the same data may be written in different addresses (different pages). In other words, the non-volatile storage system 1000B may write the same data to different addresses for redundancy.

When the same data is written to different addresses for redundancy, the unit for writing the same data may be as follows.

(1) When a plurality of non-volatile memories are provided, data may be written in units of blocks or the in units of pages.

(2) When a single non-volatile memory is provided and a plurality of planes are provided, data may be written in units of blocks or in units of pages.

In this case, the blocks (or pages) for writing the same data are preferably blocks (or pages) included in different planes.

As described above, even when the same data has been written to different addresses, the non-volatile storage system 1000B performs high-speed data readout processing while ensuring high error correction capability by processing in the same manner as described above.

Other Embodiments

A non-volatile storage system, a non-volatile storage device, or the like may be configured by combining some or all of the above embodiments and modifications.

In the above embodiment (including a modified example), a case where the non-volatile memory is a TLC NAND flash memory (TLC: Triple Level Cell) is assumed as an example, but the present invention should not be limited to this; for example, the non-volatile memory may be an MLC NAND flash memory (MLC: Multi Level Cell) or a QLC NAND flash memory (QLC: Quadruple Level Cell).

Further, a part or all of the non-volatile storage system and the non-volatile storage device of the above embodiment may be implemented as an integrated circuit (for example, LSI, system LSI, and the like).

Each block of the non-volatile storage system and the non-volatile storage device described in the above embodiments may be formed using a single chip with a semiconductor device, such as LSI, or some or all of the blocks of the non-volatile storage system and the non-volatile storage device may be formed using a single chip. Further, each block (each functional unit) of the non-volatile storage system and the non-volatile storage device described in the above embodiments may be implemented with a semiconductor device such as a plurality of LSIs.

Note that although the term LSI is used here, it may also be called IC, system LSI, super LSI, or ultra LSI depending on the degree of integration.

Further, the method of circuit integration should not be limited to LSI, and it may be implemented with a dedicated circuit or a general-purpose processor. A field programmable gate array (FPGA) that can be programmed after the LSI is manufactured, or a reconfigurable processor that can reconfigure connection and setting of circuit cells inside the LSI may be used.

Further, a part or all of the processing of each functional block of each of the above embodiments may be implemented with a program. Apart or all of the processing of each functional block of each of the above-described embodiments is then performed by a central processing unit (CPU) in a computer. The programs for these processes may be stored in a storage device, such as a hard disk or a ROM, and may be executed from the ROM or be read into a RAM and then executed.

The processes described in the above embodiments may be implemented by using either hardware or software (including use of an operating system (OS), middleware, or a predetermined library), or may be implemented using both software and hardware. Further, it may be achieved with mixed processing of software and hardware.

Figure 9:
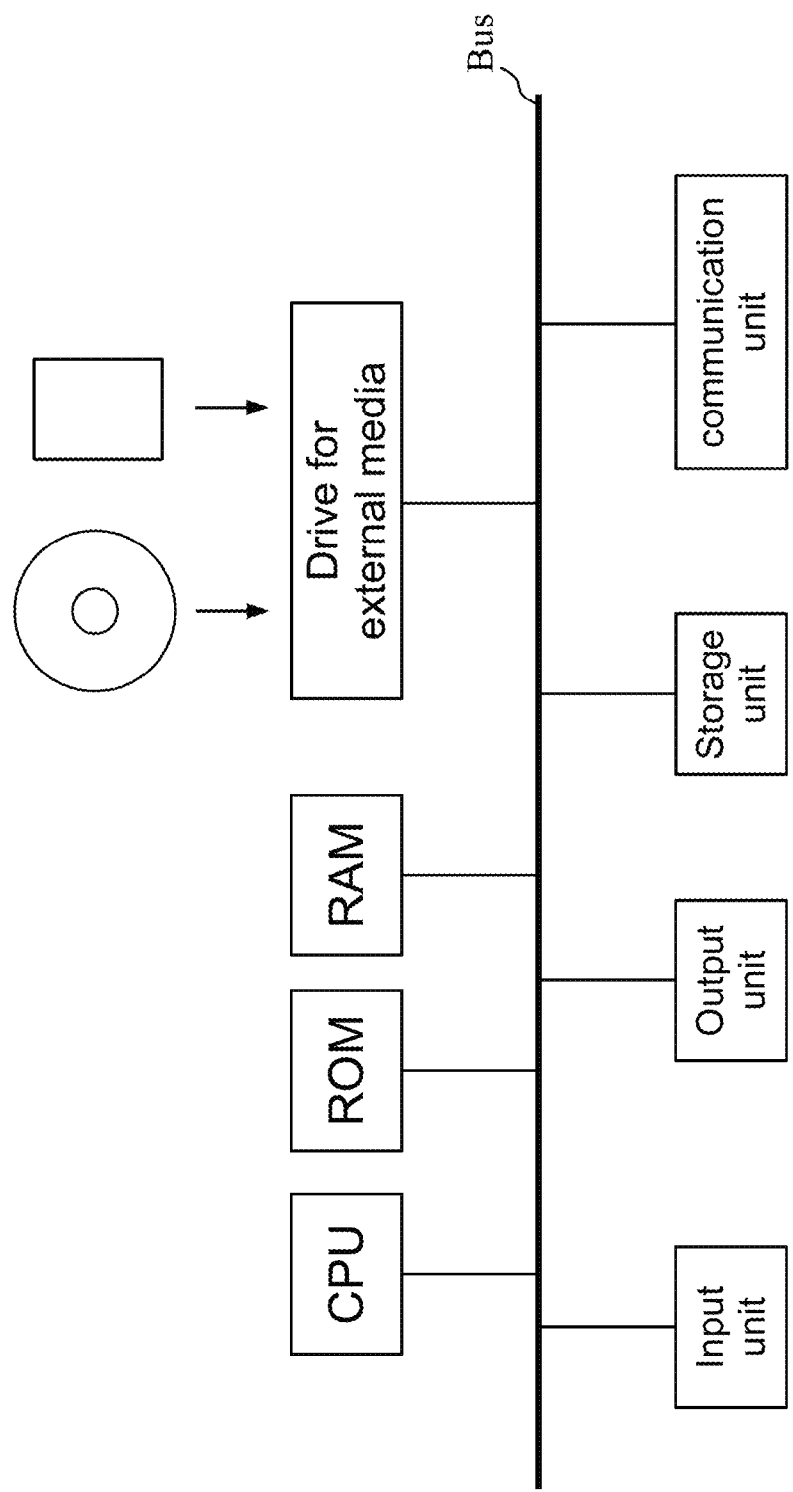
FIG. 9 is a diagram showing a CPU bus configuration.

For example, when functional units of the above embodiments and modifications is achieved by using software, the hardware structure (the hardware structure including CPU, ROM, RAM, an input unit, an output unit or the like, each of which is connected to a bus) shown in FIG. 9 may be employed to achieve the functional units by using software.

The processes described in the above embodiments may not be performed in the order specified in the above embodiments. The order in which the processes are performed may be changed without departing from the scope and the spirit of the invention.

The present invention may also include a computer program enabling a computer to implement the method described in the above embodiments and a computer readable recording medium on which such a program is recorded. Examples of the computer readable recording medium include a flexible disk, a hard disk, a CD-ROM, an MO, a DVD, a DVD-ROM, a DVD-RAM, a large capacity DVD, a next-generation DVD, and a semiconductor memory.

The computer program may not be recorded on the recording medium but may be transmitted with an electric communication line, a radio or cable communication line, or a network such as the Internet.

The term "unit" may include "circuitry," which may be partly or entirely implemented by using either hardware or software, or both hardware and software.

The functionality of the elements disclosed herein may be implemented using circuitry or processing circuitry which includes general purpose processors, special purpose processors, integrated circuits, ASICs ("Application Specific Integrated Circuits"), conventional circuitry and/or combinations thereof which are configured or programmed to perform the disclosed functionality. Processors are considered processing circuitry or circuitry as they include transistors and other circuitry therein. In the disclosure, the circuitry, units, or means are hardware that carry out or are programmed to perform the recited functionality. The hardware may be any hardware disclosed herein or otherwise known which is programmed or configured to carry out the recited functionality. When the hardware is a processor which may be considered a type of circuitry, the circuitry, means, or units are a combination of hardware and software, the software being used to configure the hardware and/or processor.

The specific structures described in the above embodiments are mere examples of the present invention, and may be changed and modified variously without departing from the scope and the spirit of the invention.

REFERENCE SIGNS LIST 1000, 1000A, 1000B non-volatile storage system
2, 2A, 2B non-volatile storage device
IB22B memory interface
24 diversity synthesis processing unit
25 data holding unit
26 ECC decoding unit
MEM1 non-volatile memory

What is claimed is:

1. A non-volatile storage device comprising:
a memory interface circuitry that performs data write processing and/or data readout processing to the non-volatile memory; and
an error correction processing circuitry that performs error correction code decoding processing on data read from the non-volatile memory by the memory interface circuitry,
wherein (1) when the error correction code decoding processing is performed on the data read from a first address of the non-volatile memory by the memory interface circuitry, and the error correction processing determines that decoding an error correction code has been successful, the error correction processing circuitry outputs data obtained by the error correction code decoding processing,
wherein (2) when the error correction code decoding processing is performed on data read from the first address of the non-volatile memory by the memory interface circuitry, and the error correction processing determines that decoding an error correction code has failed, the memory interface circuitry reads data from the first address of the non-volatile memory again,
wherein the error correction processing circuitry performs diversity synthesis processing, which is a process of synthesizing the data read for the first time from the first address and the data read for the second time from the first address, performs the error correction code decoding processing on data obtained by the diversity synthesis processing, and outputs data obtained by the error correction code decoding processing when decoding the error correction code has been successful,
wherein when it is determined that decoding the error correction code for the data obtained by performing the diversity synthesis processing using the data read for the first time from the first address and the data read for the second time from the first address has failed, the memory interface circuitry further reads data from the first address of the non-volatile memory, performs diversity synthesis processing on the latest readout data, which is the data read from the first address, and data read from the first address of the non-volatile memory before reading the latest readout data, and performs the error correction code decoding processing on the data obtained by the diversity synthesis processing, and
wherein when decoding the error correction code by the error correction code decoding processing has been successful, the memory interface circuitry outputs the data obtained by the error correction code decoding processing, whereas when decoding the error correction code by the error correction code decoding processing has failed, the memory interface circuitry further reads data from the first address of the non-volatile memory, performs diversity synthesis processing on the latest readout data, which is the data read from the first address, and data read from the first address of the non-volatile memory before reading the latest readout data, performs the error correction code decoding processing on the data obtained by the diversity synthesis processing, and repeatedly performs the above processing.

2. The non-volatile storage device according to claim 1, wherein
when it is determined that decoding the error correction code for the data obtained by performing the diversity synthesis processing has failed, the memory interface circuitry adjusts a threshold voltage when reading data from the non-volatile memory, and reads data from the non-volatile memory.

3. The non-volatile storage device according to claim 2, wherein
when it is determined that decoding the error correction code for the data obtained by performing the diversity synthesis processing has failed, and the memory cell of the non-volatile memory at the first address has been greatly affected by data retention, the memory interface circuitry adjusts the threshold voltage such that the threshold voltage when reading data from the non-volatile memory is lower than a reference threshold voltage when reading data from the non-volatile memory, and then readout data from the non-volatile memory.

4. The non-volatile storage device according to claim 2, wherein
when it is determined that decoding the error correction code for the data obtained by performing the diversity synthesis processing has failed, and the memory cell of the non-volatile memory at the first address has been greatly affected by read disturbance, the memory interface circuitry adjusts the threshold voltage such that the threshold voltage when reading data from the non-volatile memory is higher than a reference threshold voltage when reading data from the non-volatile memory, and then readout data from the non-volatile memory.

5. The non-volatile storage device according to claim 1, wherein
when it is determined that decoding the error correction code for the data obtained by performing the diversity synthesis processing has failed, the memory interface circuitry reads data from the first address of the non-volatile memory after a predetermined time has lapsed.

6. A data readout method used for a non-volatile storage device including a memory interface circuitry that performs data write processing and/or data readout processing to the non-volatile memory; and an error correction processing circuitry that performs error correction code decoding processing on data read from the non-volatile memory by the memory interface circuitry, the method comprising;
a first step, in which (1) when the error correction code decoding processing is performed on the data read from a first address of the non-volatile memory by the memory interface circuitry, and the error correction processing determines that decoding an error correction code has been successful, the error correction processing circuitry outputs data obtained by the error correction code decoding processing; and
a second step in which (2) when the error correction code decoding processing is performed on data read from the first address of the non-volatile memory by the memory interface circuitry, and the error correction processing determines that decoding an error correction code has failed, the memory interface circuitry reads data from the first address of the non-volatile memory again, the error correction processing circuitry performs diversity synthesis processing, which is a process of synthesizing the data read for the first time from the first address and the data read for the second time from the first address, performs the error correction code decoding processing on data obtained by the diversity synthesis processing, and outputs data obtained by the error correction code decoding processing when decoding the error correction code has been successful, and a third step in when it is determined that decoding the error correction code for the data obtained by performing the diversity synthesis processing using the data read for the first time from the first address and the data read for the second time from the first address has failed, the memory interface circuitry further reads data from the first address of the non-volatile memory, performs diversity synthesis processing on the latest readout data, which is the data read from the first address, and data read from the first address of the non-volatile memory before reading the latest readout data, and performs the error correction code decoding processing on the data obtained by the diversity synthesis processing, and when decoding the error correction code by the error correction code decoding processing has been successful, the memory interface circuitry outputs the data obtained by the error correction code decoding processing, whereas when decoding the error correction code by the error correction code decoding processing has failed, the memory interface circuitry further reads data from the first address of the non-volatile memory, performs diversity synthesis processing on the latest readout data, which is the data read from the first address, and data read from the first address of the non-volatile memory before reading the latest readout data, performs the error correction code decoding processing on the data obtained by the diversity synthesis processing, and repeatedly performs the above processing.

7. A non-transitory computer readable storage medium storing a program for causing a computer to execute the data readout method according to claim 6.

\* \* \* \* \*